United States Patent
Son et al.

(10) Patent No.: US 12,414,448 B2
(45) Date of Patent: Sep. 9, 2025

(54) DISPLAY DEVICE

(71) Applicant: Samsung Display Co., LTD., Yongin-si (KR)

(72) Inventors: Yong Duck Son, Seongnam-si (KR); Sang Woo An, Anyang-si (KR); Chan Hyun Park, Cheonan-si (KR); Da Bin Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 757 days.

(21) Appl. No.: 17/581,633

(22) Filed: Jan. 21, 2022

(65) Prior Publication Data
US 2022/0238628 A1     Jul. 28, 2022

(30) Foreign Application Priority Data
Jan. 28, 2021 (KR) .......... 10-2021-0012148

(51) Int. Cl.
*H10K 59/131* (2023.01)
*H10K 59/80* (2023.01)

(52) U.S. Cl.
CPC ....... *H10K 59/131* (2023.02); *H10K 59/8792* (2023.02)

(58) Field of Classification Search
CPC ............. H10K 59/131; H10K 59/8792; H10K 59/38; H10K 59/123; H01L 27/124; H10D 86/441
See application file for complete search history.

(56) References Cited

U.S. PATENT DOCUMENTS

2016/0377904 A1* 12/2016 Shin ............... G02F 1/13452
                                              257/776
2019/0051668 A1*  2/2019 Huang ............ H01L 27/0296

FOREIGN PATENT DOCUMENTS

| KR | 2001-0061382 A   | 7/2001  |
|----|------------------|---------|
| KR | 10-2008-0018773 A | 2/2008  |
| KR | 10-2008-0044503 A | 5/2008  |
| KR | 10-2016-0084006 A | 7/2016  |
| KR | 10-2016-0143967 A | 12/2016 |
| KR | 10-2018-0078478 A | 7/2018  |

* cited by examiner

*Primary Examiner* — Patricia D Valenzuela
(74) *Attorney, Agent, or Firm* — Womble Bond Dickinson (US) LLP

(57) ABSTRACT

A display device includes: a substrate; fan-out lines on the substrate; signal lines on the substrate, and spaced from the fan-out lines; and connection lines connecting the fan-out lines to the signal lines. The fan-out lines include: first fan-out lines of a first fan-out group; and second fan-out lines of a second fan-out group adjacent to the first fan-out group. An outermost first fan-out line of the first fan-out group that is located closest to the second fan-out group and an outermost second fan-out line of the second fan-out group that is located closest to the first fan-out group are connected to signal lines from among the signal lines, respectively, and a distance between the outermost first fan-out line and the outermost second fan-out line is greater than a distance between the signal lines respectively connected to the outermost first fan-out line and the outermost second fan-out line.

20 Claims, 20 Drawing Sheets

DISPLAY DEVICE

CROSS-REFERENCE TO RELATED APPLICATION

This application claims priority to and the benefit of Korean Patent Application No. 10-2021-0012148, filed on Jan. 28, 2021, in the Korean Intellectual Property Office, the entire content of which is incorporated by reference herein.

BACKGROUND

1. Field

Aspects of one or more embodiments of the present disclosure relate to a display device.

2. Description of the Related Art

Display devices are becoming increasingly important with the development of multimedia. Accordingly, various types of display devices, for example, such as organic light emitting displays (OLEDs) and liquid crystal displays (LCDs), are being used. These display devices are being applied to an increasingly wide variety of devices, including mainly to various kinds of mobile electronic devices such as various suitable portable electronic devices, for example, such as smartphones, smart watches, and tablet personal computers (PCs).

An electrostatic discharge phenomenon may occur in a process of manufacturing a display device. Electric charges generated by static electricity may damage thin-film transistors and insulating layers of the display device, and thus, may cause deterioration of a display panel included in the display device, which may affect production yield.

The above information disclosed in this Background section is for enhancement of understanding of the background of the present disclosure, and therefore, it may contain information that does not constitute prior art.

SUMMARY

One or more embodiments of the present disclosure are directed to a display device that may minimize or reduce an electrostatic discharge phenomenon occurring in a process of manufacturing the display device by securing a sufficient distance between neighboring (e.g., adjacent ones of) fan-out line groups.

However, the aspects and features of the present disclosure are not restricted to the ones set forth herein. The above and other aspects and features of the present disclosure will become more apparent to one of ordinary skill in the art to which the present disclosure pertains by referencing the detailed description, the figures, and the claims and their equivalents.

According to one or more embodiments of the present disclosure, a display device includes: a substrate; a plurality of fan-out lines on the substrate; a plurality of signal lines on the substrate, and spaced from the fan-out lines; and a plurality of connection lines connecting the fan-out lines to the signal lines, respectively. The fan-out lines include: a plurality of first fan-out lines of a first fan-out group; and a plurality of second fan-out lines of a second fan-out group, the first fan-out group and the second fan-out group being adjacent to each other. An outermost first fan-out line of the first fan-out group that is located closest to the second fan-out group and an outermost second fan-out line of the second fan-out group that is located closest to the first fan-out group are connected to signal lines from among the plurality of signal lines, respectively, and a distance between the outermost first fan-out line and the outermost second fan-out line is greater than a distance between the signal lines respectively connected to the outermost first fan-out line and the outermost second fan-out line.

In an embodiment, the distance between the outermost first fan-out line and the outermost second fan-out line may be greater than a distance between adjacent ones of the first fan-out lines in the first fan-out group.

In an embodiment, the distance between the outermost first fan-out line and the outermost second fan-out line may be greater than or equal to a distance between connection lines from among the plurality of connection lines respectively connected to the outermost first fan-out line and the outermost second fan-out line.

In an embodiment, a distance between outermost neighboring first fan-out lines in the first fan-out group may be smaller than or equal to a distance between neighboring first fan-out lines in the first fan-out group adjacent to the outermost neighboring first fan-out lines.

In an embodiment, the plurality of connection lines may include: a plurality of first connection lines electrically connecting the plurality of first fan-out lines to corresponding ones of the plurality of signal lines; and a plurality of second connection lines electrically connecting the plurality of second fan-out lines to corresponding ones of the plurality of signal lines.

In an embodiment, one of the first connection lines may include: a first sub-connection line electrically connected to a corresponding first fan-out line of the plurality of first fan-out lines; a second sub-connection line electrically connected to a corresponding signal line from among the plurality of signal lines; and a third sub-connection line electrically connecting the first sub-connection line and the second sub-connection line to each other.

In an embodiment, the third sub-connection line may extend in a first direction, and the first sub-connection line and the second sub-connection line may extend in a second direction different from the first direction.

In an embodiment, the distance between the outermost first fan-out line and the outermost second fan-out line may be greater than a distance between a first connection line from among the plurality of first connection lines and a second connection line from among the plurality of second connection lines respectively connected to the outermost first fan-out line and the outermost second fan-out line.

In an embodiment, ends of at least two neighboring first fan-out lines in the first fan-out group may be aligned with each other along a direction in which the signal lines extend.

According to one or more embodiments of the present disclosure, a display device includes: a substrate; a first conductive layer on the substrate, and including: a first fan-out group including a plurality of first fan-out lines: a second fan-out group including a plurality of second fan-out lines at a side of the first fan-out group in a first direction; a first signal group including a plurality of first signal lines spaced from the first fan-out group in a second direction crossing the first direction; and a second signal group including a plurality of second signal lines spaced from the second fan-out group in the second direction; and a second conductive layer on the first conductive layer, and including: a plurality of first connection lines electrically connecting the first fan-out lines to the first signal lines; and a plurality of second connection lines electrically connecting the second fan-out lines to the second signal lines. A distance between the first fan-out group and the second fan-out group is greater than a distance between the first connection lines and the second connection lines.

In an embodiment, the distance between the first fan-out group and the second fan-out group may be greater than a distance between the first signal group and the second signal group.

In an embodiment, the distance between the first fan-out group and the second fan-out group may be greater than a distance between neighboring ones of the first fan-out lines in the first fan-out group.

In an embodiment, the distance between the first fan-out group and the second fan-out group may be greater than or equal to a distance between the first signal group and the first fan-out group.

In an embodiment, a distance between two outermost neighboring first fan-out lines in the first fan-out group may be smaller than or equal to the distance between neighboring first fan-out lines in the first fan-out group adjacent to the two outermost neighboring first fan-out lines.

In an embodiment, the display device may further include: a third conductive layer between the first conductive layer and the second conductive layer. One of the first connection lines may include: a first sub-connection line electrically connected to a corresponding first fan-out line from among the plurality of first fan-out lines; and a second sub-connection line electrically connected to a corresponding first signal line from among the plurality of first signal lines, and the third conductive layer may include a third connection line electrically connecting the first sub-connection line and the second sub-connection line to each other.

In an embodiment, the first sub-connection line and the second sub-connection line may extend in the second direction, and the third connection line may extend in the first direction.

In an embodiment, ends of at least two first fan-out lines in the first fan-out group may be aligned with each other along the second direction.

According to one or more embodiments of the present disclosure, a display device includes: a substrate; a plurality of fan-out lines on the substrate; a plurality of signal lines on the substrate, and spaced from the fan-out lines; and a plurality of connection lines connecting the fan-out lines to the signal lines, respectively. The fan-out lines include: a plurality of first fan-out lines of a first fan-out group; and a plurality of second fan-out lines of a second fan-out group, the first fan-out lines in the first fan-out group including an outermost first fan-out line located closest to the second fan-out group, and the second fan-out lines in the second fan-out group including an outermost second fan-out line located closest to the first fan-out group. The signal lines include: an outermost first signal line connected to the outermost first fan-out line; and an outermost second signal line connected to the outermost second fan-out line. The connection lines include: an outermost first connection line connecting the outermost first fan-out line to the outermost first signal line; and an outermost second connection line connecting the outermost second fan-out line to the outermost second signal line, the outermost first connection line including: a first sub-connection line connected to the outermost first fan-out line; a second sub-connection line connected to the outermost first signal line; and a third sub-connection line connecting the first sub-connection line and the second sub-connection line to each other, and the outermost second connection line including: a fourth sub-connection line connected to the outermost second fan-out line; a fifth sub-connection line connected to the outermost second signal line; and a sixth sub-connection line connecting the fourth sub-connection line and the fifth sub-connection line to each other. A distance between the first sub-connection line and the fourth sub-connection line is greater than a distance between the second sub-connection line and the fifth sub-connection line.

In an embodiment, the third sub-connection line may extend in a first direction, and the first sub-connection line and the second sub-connection line may extend in a second direction different from the first direction.

In an embodiment, the first sub-connection line and the second sub-connection line may be at a first conductive layer, and the third sub-connection line may be at a second conductive layer different from the first conductive layer.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
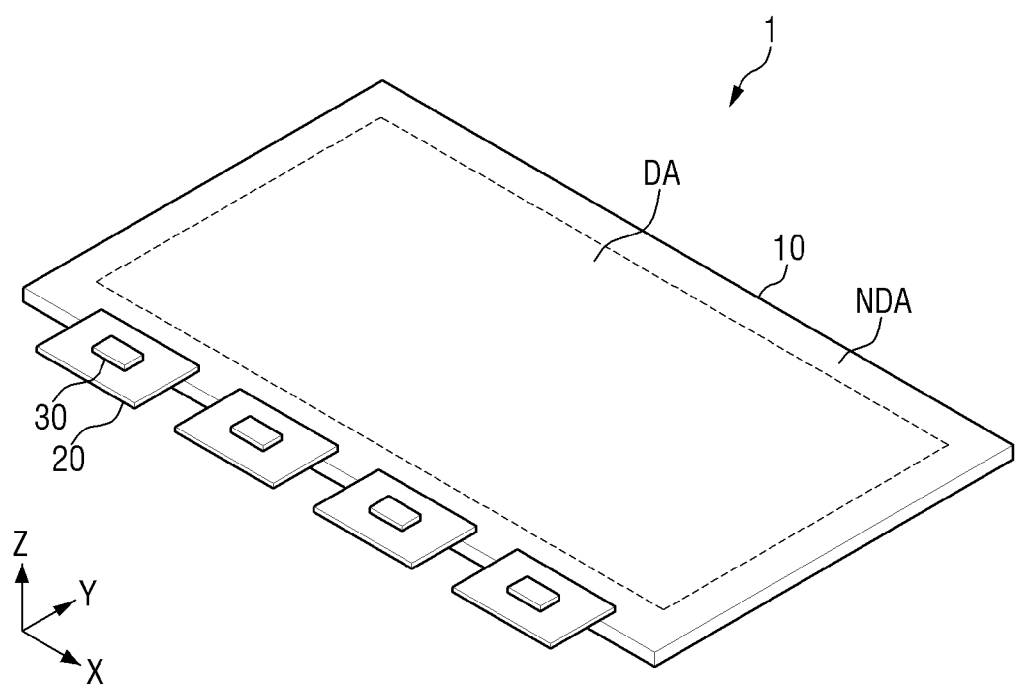
FIG. 1 is a perspective view of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, a first direction X, a second direction Y, and a third direction Z are not limited to three axes of the rectangular coordinate system, and may be interpreted in a broader sense. For example, the first direction X, the second direction Y, and the third direction Z may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device 1 according to an embodiment.

Referring to FIG. 1, the display device 1 according to the present embodiment is a device for displaying moving images and/or still images. The display device 1 may be used as a display screen in various suitable portable electronic devices, for example, such as mobile phones, smartphones, tablet personal computers (PCs), smart watches, watch phones, mobile communication terminals, electronic notebooks, electronic books, portable multimedia players (PMPs), navigation devices, and/or ultra-mobile PCs (UMPCs), as well as in various suitable products, for example, such as televisions, notebook computers, monitors, billboards, and Internet of Things (IoT) devices.

The display device 1 according to the present embodiment includes a display panel 10, display driving circuits 30, and circuit boards 20.

The display panel 10 may be formed in a quadrangular shape (e.g., in a plan view or a view from a direction that is perpendicular to or substantially perpendicular to a top surface of the relevant component, element, or layer), for example, such as a rectangular shape having long sides extending in a first direction X, and short sides extending in a second direction Y crossing (e.g., intersecting) the first direction X. Each corner where a long side extending in the first direction X meets a short side extending in the second direction Y may be a right-angled corner. However, the present disclosure is not limited thereto, and each corner may be rounded with a suitable curvature (e.g., a predetermined curvature). The planar shape (e.g., a shape when viewed in a plan view) of the display panel 10 is not limited to a quadrangular shape, and may include other suitable polygonal shapes, a circular shape, or an oval shape.

The display panel 10 may include a display area DA for displaying an image, and a non-display area NDA disposed around (e.g., adjacent to) the display area DA. The display area DA may occupy most of the display panel 10. The display area DA may be disposed at (e.g., in or on) a central area (e.g., the center) of the display panel 10. A plurality of pixels PX (e.g., see FIG. 2) may be disposed at (e.g., in or on) the display area DA to display an image.

The non-display area NDA may neighbor (e.g., may be adjacent to) the display area DA. The non-display area NDA may be an area outside the display area DA. The non-display area NDA may surround (e.g., around a periphery of) the display area DA. The non-display area NDA may be located at edges of the display area DA.

The circuit boards 20 may be disposed at (e.g., in or on) the non-display area NDA. In more detail, the circuit boards 20 may be disposed on an edge of the display panel 10. Although the display device 1 including four circuit boards 20 is illustrated in FIG. 1, the number of circuit boards 20 is not limited to four, and the display device 1 may include any suitable number of circuit boards 20.

The display panel 10 may receive data signals, power supply voltages, and scan control signals through the circuit boards 20. The circuit boards 20 may be flexible printed circuit boards, printed circuit boards, or flexible films, for example, such as chip-on-films.

The display driving circuits 30 may generate the data signals and the scan control signals. The display driving circuits 30 may supply the data signals and the scan control signals to the display panel 10 through the circuit boards 20. As another example, the scan control signals may be generated by a timing driving circuit, instead of by the display driving circuits 30, and may be supplied to the display panel 10 through the circuit boards 20. The display driving circuits 30 may be formed as integrated circuits, and attached onto the circuit boards 20, respectively.

Figure 2:
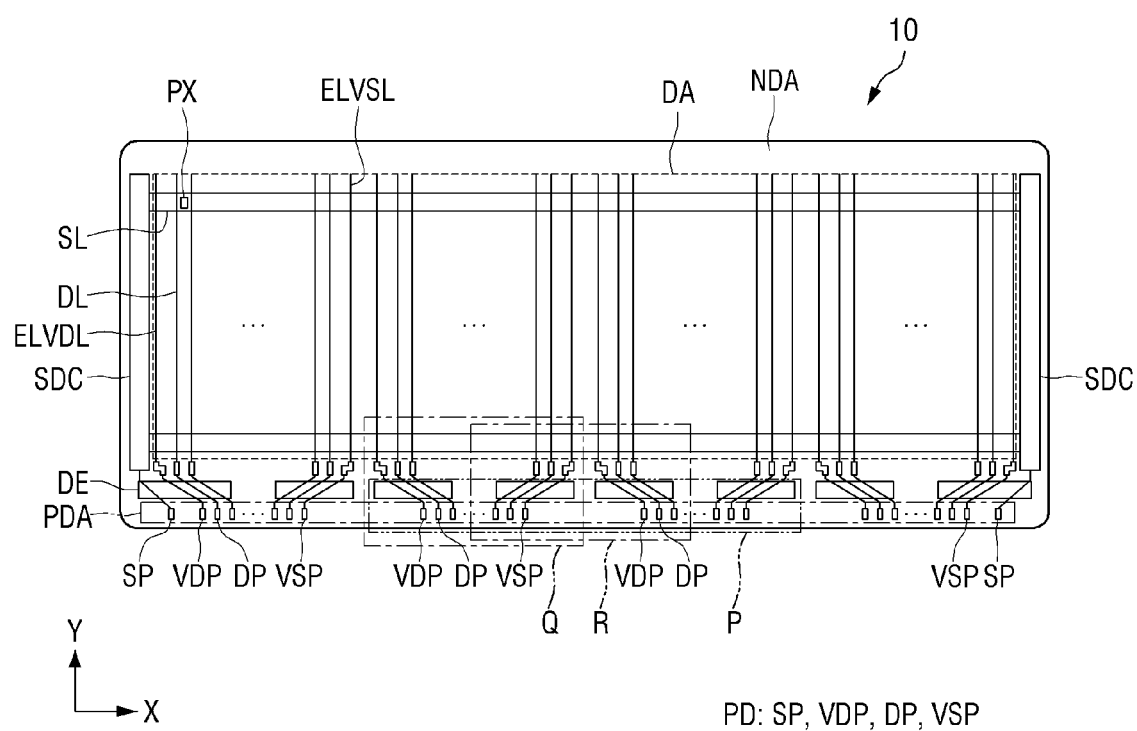
FIG. 2 is a layout view of an example of a display panel of FIG. 1.

FIG. 2 is a layout view of an example of the display panel 10 of FIG. 1.

Figure 5:
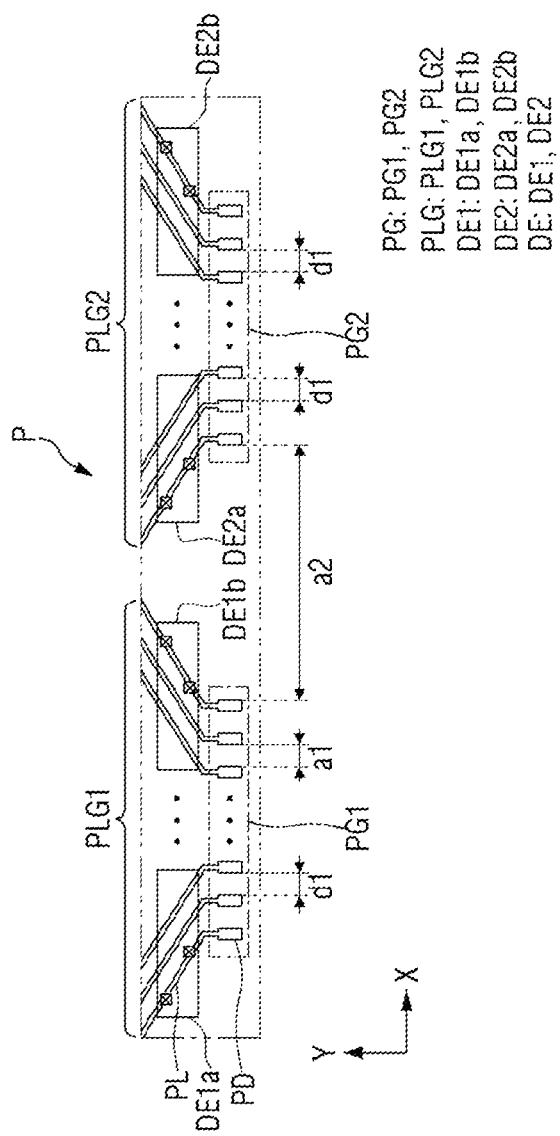
FIG. 5 is an enlarged view of the area P of FIG. 2.

Referring to FIG. 2, the display panel 10 may include the plurality of pixels PX, a plurality of scan drivers SDC, a plurality of scan lines SL, a plurality of data lines DL, first and second power lines ELVDL and ELVSL, a plurality of pads PD, and a plurality of fan-out lines PL (e.g., see FIG. 5).

The pixels PX, the scan lines SL, the data lines DL, and the first and second power lines ELVDL and ELVSL may be disposed at (e.g., in or on) the display area DA of the display panel 10.

The scan lines SL may extend in the first direction X, and may be arranged along the second direction Y. The scan lines SL may be connected to the scan drivers SDC, and scan signals provided from the scan drivers SDC may be transmitted to the scan lines SL.

Each of the data lines DL may extend in the second direction Y. The data lines DL may be arranged along the first direction X. Each of the data lines DL may be connected to a corresponding display pad DP. Therefore, each of the data lines DL may be electrically connected to a corresponding display driving circuit 30 of a corresponding circuit board 20 through the corresponding display pad DP. Data signals provided from the display driving circuits 30 may be transmitted to the data lines DL.

The pixels PX may be arranged along the first direction X and the second direction Y. In other words, the pixels PX may be arranged in a suitable matrix form. A structure of each pixel PX will be described in more detail below.

The pads PD and the fan-out lines PL extending from the pads PD, respectively, may be disposed at (e.g., in or on) the non-display area NDA of the display panel 10. The pads PD may include a plurality of display pads DP, a plurality of scan pads SP, a plurality of first power pads VDP, and a plurality of second power pads VSP. The fan-out lines PL will be described in more detail below with reference to FIGS. 5 through 7.

The scan drivers SDC may be connected to the scan pads SP. Therefore, the scan drivers SDC may be electrically connected to the circuit boards 20 through the scan pads SP. Scan control signals provided from the circuit boards 20 may be transmitted to the scan drivers SDC. The scan drivers SDC may generate scan signals according to the scan control signals, and may supply the scan signals to the scan lines SL.

Although a plurality of the scan drivers SDC are shown in FIG. 2 as being disposed at (e.g., in or on) the non-display area NDA on the left and right sides outside of the display area DA, the present disclosure is not limited thereto. For example, a scan driver (e.g., one scan driver) SDC may be disposed at (e.g., in or on) the non-display area NDA on any one of the left and right sides outside of the display area DA.

The pads PD may be disposed at (e.g., in or on) a pad area PDA disposed on a second side of the display panel 10 in the second direction Y. The pad area PDA may extend along the first direction X at (e.g., in or on) the non-display area NDA disposed on the second side of the display area DA in the second direction Y.

The pads PD may be arranged along the first direction X at (e.g., in or on) the pad area PDA. The pads PD may form pad groups PG (e.g., see FIG. 5) at (e.g., in or on) the pad area PDA. A pad group PG may be a set (e.g., a group) of neighboring pads (e.g., adjacent pads) PD that are spaced apart from one another by the same or substantially the same distance. The pad groups PG will be described in detail below.

The display pads DP, the first power pads VDP disposed at (e.g., in or on) a side of the display pads DP, and the second power pads VSP disposed at (e.g., in or on) another side of the display pads DP may be disposed at (e.g., in or on) the pad area PDA.

The display pads DP may be arranged in a row along the first direction X. However, the present disclosure is not limited thereto, and the display pads DP may be arranged in a plurality of rows. The fan-out lines PL extending in the second direction Y may be connected to the display pads DP.

In one pad group PG (e.g., see FIG. 6), a first power pad VDP may be disposed at (e.g., in or on) a second side of a plurality of display pads DP in the first direction X. A fan-out line PL extending in the second direction Y may be connected to the first power pad VDP. The fan-out line PL connected to the first power pad VDP may be electrically connected to a first power line ELVDL.

In one pad group PG (e.g., see FIG. 6), a second power pad VSP may be disposed at (e.g., in or on) a first side of the plurality of display pads DP in the first direction X. A fan-out line PL extending in the second direction Y may be connected to the second power pad VSP. The fan-out line PL connected to the second power pad VSP may be electrically connected to a second power line ELVSL.

The first power line ELVDL extending in the second direction Y from the first power pad VDP may branch into a plurality of lines in the first direction X, and may be connected to a pixel electrode PXE (e.g., see FIG. 4) of each pixel PX. The second power line ELVSL extending in the second direction Y from the second power pad VSP may be electrically connected to a common electrode CME (e.g., see FIG. 4), which will be described in more detail below.

Figure 3:
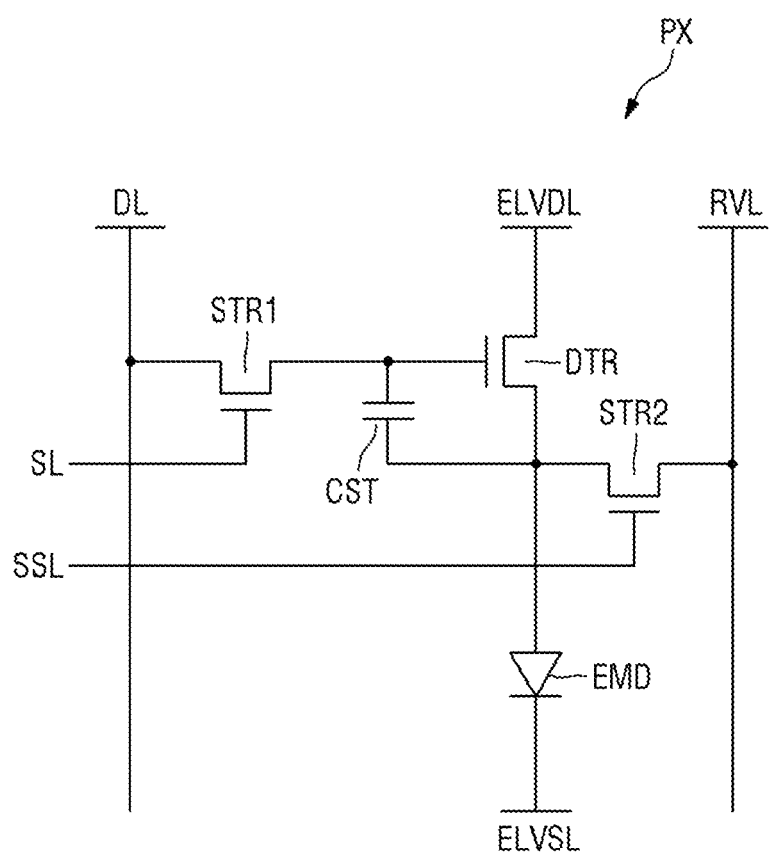
FIG. 3 is an equivalent circuit diagram of a pixel of the display device according to an embodiment.

FIG. 3 is an equivalent circuit diagram of a pixel PX of the display device 1 according to an embodiment.

Referring to FIG. 3, each pixel PX of the display device 1 according to the present embodiment includes three transistors DTR, STR1, and STR2, one storage capacitor CST, and a light emitting element EMD.

The light emitting element EMD emits light according to a current supplied through a driving transistor DTR. The light emitting element EMD may be implemented as an organic light emitting diode, a micro light emitting diode, a nano light emitting diode, or the like.

A first electrode (e.g., an anode) of the light emitting element EMD may be connected to a source electrode of the driving transistor DTR, and a second electrode (e.g., a cathode) may be connected to a second power line ELVSL to which a second power supply voltage (e.g., a low-potential voltage) having a level different from (e.g., lower than) that of a first power supply voltage (e.g., a high-potential voltage) of a first power line ELVDL is supplied. Hereinafter, for convenience, the first power supply voltage may be referred to as a high-potential voltage and the second power supply voltage may be referred to as a low-potential voltage lower than the high-potential voltage, but the present disclosure is not limited thereto, and in other embodiments, the second power supply voltage may be the high-potential voltage and the first power supply voltage may be the low-potential voltage.

The driving transistor DTR adjusts a current flowing from the first power line ELVDL, to which the first power supply voltage is supplied, to the light emitting element EMD, according to a voltage difference between a gate electrode of the driving transistor DTR and the source electrode of the driving transistor DTR. The driving transistor DTR may include the gate electrode connected to a first source/drain electrode of a first switching transistor STR1, the source electrode connected to the first electrode of the light emitting element EMD, and a drain electrode connected to the first power line ELVDL to which the first power supply voltage is applied.

The first switching transistor STR1 is turned on by a scan signal of a scan line SL to connect a data line DL to the gate electrode of the driving transistor DTR. The first switching transistor STR1 may include a gate electrode connected to the scan line SL, the first source/drain electrode connected to the gate electrode of the driving transistor DTR, and a second source/drain electrode connected to the data line DL.

A second switching transistor STR2 is turned on by a sensing signal of a sensing signal line SSL to connect a reference voltage line RVL to the source electrode of the driving transistor DTR. The second switching transistor STR2 may include a gate electrode connected to the sensing signal line SSL, a first source/drain electrode connected to the reference voltage line RVL, and a second source/drain electrode connected to the source electrode of the driving transistor DTR.

In an embodiment, the first source/drain electrode of each of the first and second switching transistors STR1 and STR2 may be a source electrode, and the second source/drain electrode may be a drain electrode. However, the present disclosure is not limited thereto, and the first source/drain electrode of each of the first and second switching transistors STR1 and STR2 may be the drain electrode, and the second source/drain electrode may be the source electrode.

The storage capacitor CST is formed between the gate and source electrodes of the driving transistor DTR. The storage capacitor CST may store the difference voltage between a gate voltage and a source voltage of the driving transistor DTR.

The driving transistor DTR and the first and second switching transistors STR1 and STR2 may be formed as thin-film transistors. The driving transistor DTR and the first and second switching transistors STR1 and STR2 may be formed as N-type metal oxide semiconductor field effect transistors (MOSFETs). However, the present disclosure is not limited thereto, and the driving transistor DTR and the first and second switching transistors STR1 and STR2 may be formed as P-type MOSFETs. As another example, some of the driving transistor DTR and the first and second switching transistors STR1 and STR2 may be formed as N-type MOSFETs, and others thereof may be formed as a P-type MOSFET.

Figure 4:
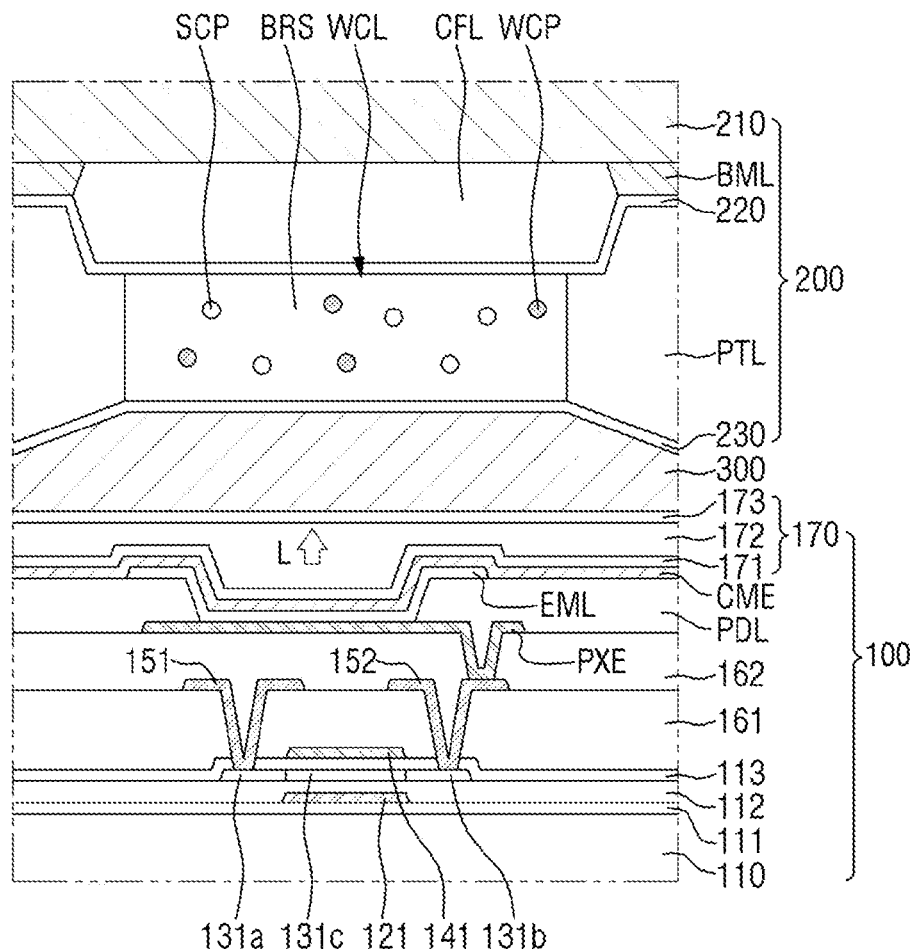
FIG. 4 is a cross-sectional view of a pixel of the display device according to an embodiment.

FIG. 4 is a cross-sectional view of a pixel PX of the display device 1 according to an embodiment.

Referring to FIG. 4, a top emission type display device in which light L is emitted in a direction (e.g., toward a second base substrate 210) opposite to a direction toward a first base substrate 110 on which a light emitting layer EML is formed is illustrated in FIG. 4 for convenience. However, the present disclosure is not limited thereto, and the display device 1 may be a bottom emission type display device or a double-sided emission type display device.

The display device 1 may include a first display substrate 100, a second display substrate 200 facing the first display substrate 100, and a filling layer 300 bonding the first display substrate 100 and the second display substrate 200 together.

The first display substrate 100 may include the base substrate 110, a barrier layer 111, a buffer layer 112, a semiconductor layer 130, a gate insulating layer 113, a second conductive layer 140, an interlayer insulating layer 161, a third conductive layer 150, a via layer 162, a pixel electrode PXE, a pixel defining layer PDL, the light emitting layer EML, a common electrode CME, and a thin-film encapsulation layer 170 that are sequentially disposed. Each of the above layers may be a single layer or a stacked layer including a plurality of layers. One or more other layers may also be disposed between some of the above layers.

The base substrate 110 supports each of the layers disposed thereon. The base substrate 110 may include (e.g., may be made of) an insulating material, for example, such as a polymer resin. However, the present disclosure is not limited thereto, and the base substrate 110 may also include a metal material.

When an organic light emitting display device is implemented as a bottom emission type or a double-sided emission type, a transparent substrate may be used. When the organic light emitting display device is implemented as a top emission type, not only the transparent substrate, but also a translucent or opaque substrate may be applied.

The barrier layer 111 may be disposed on the base substrate 110. The barrier layer 111 may prevent or substantially prevent diffusion of impurity ions, may prevent or substantially prevent penetration of moisture and/or outside air, and may perform a surface planarization function. The barrier layer 111 may include silicon nitride, silicon oxide, or silicon oxynitride. However, the present disclosure is not limited thereto, and the barrier layer 111 may be omitted depending on the type of the base substrate 110 or process conditions.

A first conductive layer 120 may be disposed on the barrier layer 111. The first conductive layer 120 may include a light blocking pattern 121. The light blocking pattern 121 may prevent or substantially prevent a photocurrent from flowing to a channel region 131c of a semiconductor pattern 131a, 131b, and 131c, which will be described in more detail below, by blocking external light from being irradiated to the channel region 131c.

The buffer layer 112 may be disposed on the first conductive layer 120. The buffer layer 112 may include at least one of silicon nitride, silicon oxide, and silicon oxynitride. However, the present disclosure is not limited thereto, and the buffer layer 112 may be omitted depending on the type of the base substrate 110 or process conditions.

The semiconductor layer 130 may be disposed on the buffer layer 112. The semiconductor layer 130 may include the semiconductor pattern 131a, 131b, and 131c.

The semiconductor pattern 131a, 131b, and 131c may include the channel region 131c overlapping with (e.g., overlapped by) a gate electrode 141 thereabove in a thickness direction, and a first source/drain region 131a and a second source/drain region 131b disposed at (e.g., in or on) opposite sides (e.g., opposite ends) of the channel region 131c, respectively. Because the first and second source/drain regions 131a and 131b may include (e.g., may contain) a plurality of carrier ions, the first and second source/drain regions 131a and 131b may have greater conductivity and lower electrical resistance than those of the channel region 131c. The semiconductor layer 130 may include (e.g., be made of) polycrystalline silicon, monocrystalline silicon, or amorphous silicon.

The gate insulating layer 113 may be disposed on the semiconductor layer 130. The gate insulating layer 113 may be disposed over the entire or substantially the entire surface of the base substrate 110. The gate insulating layer 113 may include a silicon compound, a metal oxide, or the like. For example, the gate insulating layer 113 may include silicon oxide, silicon nitride, silicon oxynitride, aluminum oxide, tantalum oxide, hafnium oxide, zirconium oxide, titanium oxide, and/or the like. These materials may be used alone or in any suitable combinations with one another.

The second conductive layer 140 may be disposed on the gate insulating layer 113. The second conductive layer 140 may be a gate conductive layer, and may include the gate electrode 141. The second conductive layer 140 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The interlayer insulating layer 161 may be disposed on the second conductive layer 140. The interlayer insulating layer 161 may include a silicon compound, a metal oxide, or the like. For example, the interlayer insulating layer 161 may include silicon oxide, silicon nitride, silicon oxynitride, aluminum oxide, tantalum oxide, hafnium oxide, zirconium oxide, titanium oxide, and/or the like. These materials may be used alone or in any suitable combination with one another.

The third conductive layer 150 may be disposed on the interlayer insulating layer 161. The third conductive layer 150 may be a data conductive layer, and may include a data line DL for transmitting a data signal. The third conductive layer 150 may include a first source/drain electrode 151 and a second source/drain electrode 152 of the driving transistor DTR.

The first source/drain electrode 151 may be electrically connected to the first source/drain region 131a of the semiconductor pattern 131a, 131b, and 131c through a contact hole penetrating the interlayer insulating layer 161 and the gate insulating layer 113.

The second source/drain electrode 152 may be electrically connected to the second source/drain region 131b of the semiconductor pattern 131a, 131b, and 131c through a contact hole penetrating the interlayer insulating layer 161 and the gate insulating layer 113.

The third conductive layer 150 may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The via layer 162 may be disposed on the third conductive layer 150. The via layer 162 may be disposed on the third conductive layer 150 to completely cover an upper surface of the interlayer insulating layer 161. When the via layer 162 includes (e.g., is made of) an organic layer, an upper surface of the via layer 162 may be flat or partially flat, despite a step difference under (e.g., underneath) the via layer 162.

The via layer 162 may include an organic insulating material, for example, such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

The pixel electrode PXE may be disposed on the via layer 162. The pixel electrode PXE may be the anode. The pixel electrode PXE may be disposed separately for each pixel PX. The pixel electrode PXE may be electrically connected to the second source/drain electrode 152 through a contact hole penetrating the via layer 162.

For example, the pixel electrode PXE may have a stacked structure in which a material layer having a high work function, for example, such as indium tin oxide (ITO), indium zinc oxide (IZO), zinc oxide (ZnO), or indium oxide ($In_2O_3$), and a reflective material layer, for example, such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a suitable mixture thereof, are stacked. The material layer having the high work function may be disposed on the reflective material layer to be closer to the light emitting layer EML.

The pixel defining layer PDL may be disposed on the pixel electrode PXE. The pixel defining layer PDL may include an opening that partially exposes the pixel electrode PXE. The pixel defining layer PDL may partially cover the pixel electrode PXE and the via layer 162.

The pixel defining layer PDL may include (e.g., may be made of) an organic insulating material or an inorganic insulating material. For example, the pixel defining layer PDL may include at least one of a polyimide resin, an acrylic resin, a silicon compound, and/or a polyacrylic resin.

The light emitting layer EML may be disposed on the pixel electrode PXE exposed by the pixel defining layer PDL. At least a part of the light emitting layer EML may be disposed in the opening of the pixel defining layer PDL. The light emitting layer EML may partially cover an upper surface of the pixel defining layer PDL, and side surfaces of the pixel defining layer PDL that form the opening.

The light emitting layer EML may include an organic material layer. The organic material layer may include an organic light emitting layer, and may further include a hole injecting/transporting layer and an electron injecting/transporting layer.

The common electrode CME may be disposed on the light emitting layer EML. The common electrode CME may be disposed commonly (e.g., entirely) on the plurality of pixels PX without distinction between the pixels PX. The common electrode CME may be the cathode.

The common electrode CME may include a material layer having a small work function, for example, such as Li, Ca, LiF/Ca, LiF/Al, Al, Mg, Ag, Pt, Pd, Ni, Au Nd, Ir, Cr, BaF, Ba, or a suitable compound or mixture thereof (e.g., a mixture of Ag and Mg). The common electrode CME may further include a transparent metal oxide layer disposed on the material layer having the small work function.

The pixel electrode PXE, the light emitting layer EML, and the common electrode CME may form (e.g., may constitute) the light emitting element EMD. The light emitting element EMD may be, for example, an organic light emitting element. In an embodiment, a wavelength of light emitted from the light emitting element EMD may be the same or substantially the same for each pixel PX. For example, the light emitting layer EML of each pixel PX may emit blue light or ultraviolet light, and the second display substrate 200, which will be described in more detail below, may include a wavelength conversion layer WCL so that the pixels PX may display different colors.

In an embodiment, the wavelength of the light emitted from the light emitting layer EML may be different for different colored pixels PX. Therefore, the color of the emitted light may be different for some colored pixels PX compared to other colored pixels PX. For example, the light emitting layer EML of a first color pixel PX may emit light of a first color, the light emitting layer EML of a second color pixel PX may emit light of a second color, and the light emitting layer EML of a third color pixel PX may emit light of a third color.

The thin-film encapsulation layer 170 may be disposed on the common electrode CME. The thin-film encapsulation layer 170 may include a first inorganic layer 171, a first organic layer 172 disposed on the first inorganic layer 171, and a second inorganic layer 173 disposed on the first organic layer 172. In some embodiments, the first inorganic layer 171 and the second inorganic layer 173 may contact each other at ends of the thin-film encapsulation layer 170, so that the first organic layer 172 is sealed by the first inorganic layer 171 and the second inorganic layer 173.

Each of the first inorganic layer 171 and the second inorganic layer 173 may include silicon nitride, silicon oxide, or silicon oxynitride. The first organic layer 172 may include an organic insulating material.

The second display substrate 200 may be disposed on the thin-film encapsulation layer 170 to face the first display substrate 100.

The second base substrate 210 of the second display substrate 200 may include a transparent insulating material, for example, such as glass. The second base substrate 210 may be a rigid substrate.

A light blocking member BML may be disposed on a surface of the second base substrate 210 that faces the first base substrate 110 along a boundary of the pixel PX. The light blocking member BML may overlap with the pixel defining layer PDL of the first display substrate 100. The light blocking member BML may be formed in a grid shape in a plan view, and may include an opening that exposes the surface of the second base substrate 210.

A color filter layer CFL may be disposed on the surface of the second base substrate 210 on which the light blocking member BML is disposed. The color filter layer CFL may be disposed on the surface of the second base substrate 210 exposed through the opening of the light blocking member BML.

The color filter layer CFL may include a colorant, for example, such as a dye or pigment, that absorbs wavelengths other than a desired color wavelength (e.g., a corresponding or predetermined color wavelength). The color filter layer CFL may include a colorant of a different color for each corresponding different colored pixel PX. For example, the color filter layer CFL may include a red colorant, a green colorant, and a blue colorant.

A first capping layer 220 may be disposed on the color filter layer CFL to prevent or substantially prevent penetration of impurities, for example, such as moisture and/or air.

A partition layer PTL may be disposed on the first capping layer 220. The partition layer PTL may overlap with the light blocking member BML. The partition layer PTL may include an opening exposing an area at (e.g., in or on) which the color filter layer CFL is disposed.

The wavelength conversion layer WCL may be disposed in a space exposed by the opening of the partition layer PTL. The wavelength conversion layer WCL may be formed by an inkjet process using the partition layer PTL as banks, but the present disclosure is not limited thereto.

The wavelength conversion layer WCL may convert the wavelength of light incident from the light emitting layer EML. The wavelength conversion layer WCL may include a base resin BRS, and scatterers SCP and wavelength conversion materials WCP disposed in the base resin BRS. The base resin BRS may include a transparent organic material. The wavelength conversion materials WCP may include (e.g., may be) quantum dots, quantum rods, or phosphors. The quantum dots may include group IV nanocrystals, group II-VI compound nanocrystals, group III-V compound nanocrystals, group IV-VI nanocrystals, or a suitable combination thereof.

A second capping layer 230 may be disposed on the wavelength conversion layer WCL and the partition layer PTL. In other words, the second capping layer 230 may be disposed on the entire or substantially on the entire surface of the second display substrate 200.

The filling layer 300 may be disposed between the first display substrate 100 and the second display substrate 200. The filling layer 300 may fill a space between the first display substrate 100 and the second display substrate 200, and may bond the first display substrate 100 and the second display substrate 200 together. The filling layer 300 may be disposed between the thin-film encapsulation layer 170 of the first display substrate 100 and the second capping layer 230 of the second display substrate 200. The filling layer 300 may include a Si-based organic material or an epoxy-based organic material, but the present disclosure is not limited thereto.

FIG. 5 is an enlarged view of the area P of FIG. 2.

Referring to FIG. 5 in conjunction with FIG. 2, the display panel 10 included in the display device 1 according to the present embodiment may include the pad area PDA at (e.g., in or on) which the pads PD are disposed as described above. The pad area PDA may be disposed at (e.g., in or on) the second side of the display panel 10 in the second direction Y, and may extend along the first direction X. The pads PD may be arranged along the first direction X at (e.g., in or on) the pad area PDA. The pads PD disposed at (e.g., in or on) the pad area PDA may form a plurality of pad groups PG. A pad group PG may be defined as a set (e.g., a group) of pads PD overlapping with one (e.g., the same) circuit board 20. The pads PD overlapping with different circuit boards 20 may belong to different pad groups PG.

In the display panel 10 included in the display device 1 according to the present embodiment, the pad groups PG may include a first pad group PG1, and a second pad group PG2 disposed at (e.g., in or on) a first side of the first pad group PG1 in the first direction X.

A distance a1 between each pair of neighboring pads (e.g., between each pair of adjacent pads) PD in one pad group PG may be the same or substantially the same as that of other pairs of neighboring pads in the one pad group PG. In other words, in an embodiment, the neighboring pads (e.g., the adjacent pads) PD that are spaced apart from each other by the same or substantially the same distance from among a plurality of the pads PD may be included in the same pad group PG. As used herein, the term "same" may mean exactly the same but may also include a difference that falls within a suitable error range (e.g., an error range of about 10% from an average value of the distances a1 between the pairs of neighboring pads PD). However, the present disclosure is not limited thereto, and the distance a1 between each pair of neighboring (e.g., adjacent) pads PD in one pad group PG may be different from those of others in the one pad group PG.

A distance a2 between the first pad group PG1 and the second pad group PG2 may refer to a distance between two closest pads PD of the first pad group PG1 and the second pad group PG2. In other words, the distance a2 between the first pad group PG1 and the second pad group PG2 may refer to a distance between a pad PD that is disposed closest to the first side in the first direction X in the first pad group PG1 and a pad PD disposed closest to a second side in the first direction X in the second pad group PG2. In other words, the distance a2 between the first pad group PG1 and the second pad group PG2 may refer to a distance between an outermost pad PD of the first pad group PG1 that is located closest to the second pad group PG2 and an outermost pad PD of the second pad group PG2 that is located closest to the first pad group PG1.

The distance a2 between the first pad group PG1 and the second pad group PG2 may be greater than the distance a1 between neighboring pads PD in one pad group PG1 or PG2. As used herein, the term "greater" may mean that the distance a2 between the first pad group PG1 and the second pad group PG2 is two times, five times, ten times, or more than the distance a1 between neighboring pads PD in one pad group PG1 or PG2.

One pad group PG may include about 100 pads PD. However, the present disclosure is not limited thereto, and the number of pads PD included in one pad group PG may be variously modified as needed or desired.

In an embodiment, an outermost pad PD on the second side of one pad group PG in the first direction X may be a first power pad VDP to which the first power supply voltage is applied, and an outermost pad PD on the first side of the one pad group PG in the first direction X may be a second power pad VSP to which the second power supply voltage is applied. The plurality of pads PD disposed between the first power pad VDP and the second power pad VSP in the one pad group PG may be the display pads DP to which data voltages are applied.

However, in the case of an outermost pad group PG of the display panel 10 on the first side in the first direction X from among the plurality of pad groups PG, an outermost pad PD on the first side in the first direction X may be a scan pad SP connected to a scan driver SDC. In addition, in the case of an outermost pad group PG of the display panel 10 on the second side in the first direction X from among the plurality of pad groups PG, an outermost pad PD on the second side in the first direction X may be a scan pad SP connected to another scan driver SDC. In other words, the outermost pads PD located at opposite ends of the plurality of pad groups PG may be the scan pads SP connected to the scan drivers SDC (e.g., see FIG. 2).

A fan-out line group PLG may extend from each pad group PG toward a first side in the second direction Y. The fan-out line group PLG may include a plurality of fan-out lines PL. The fan-out line group PLG will be described in more detail below with reference to FIG. 6.

Figure 6:
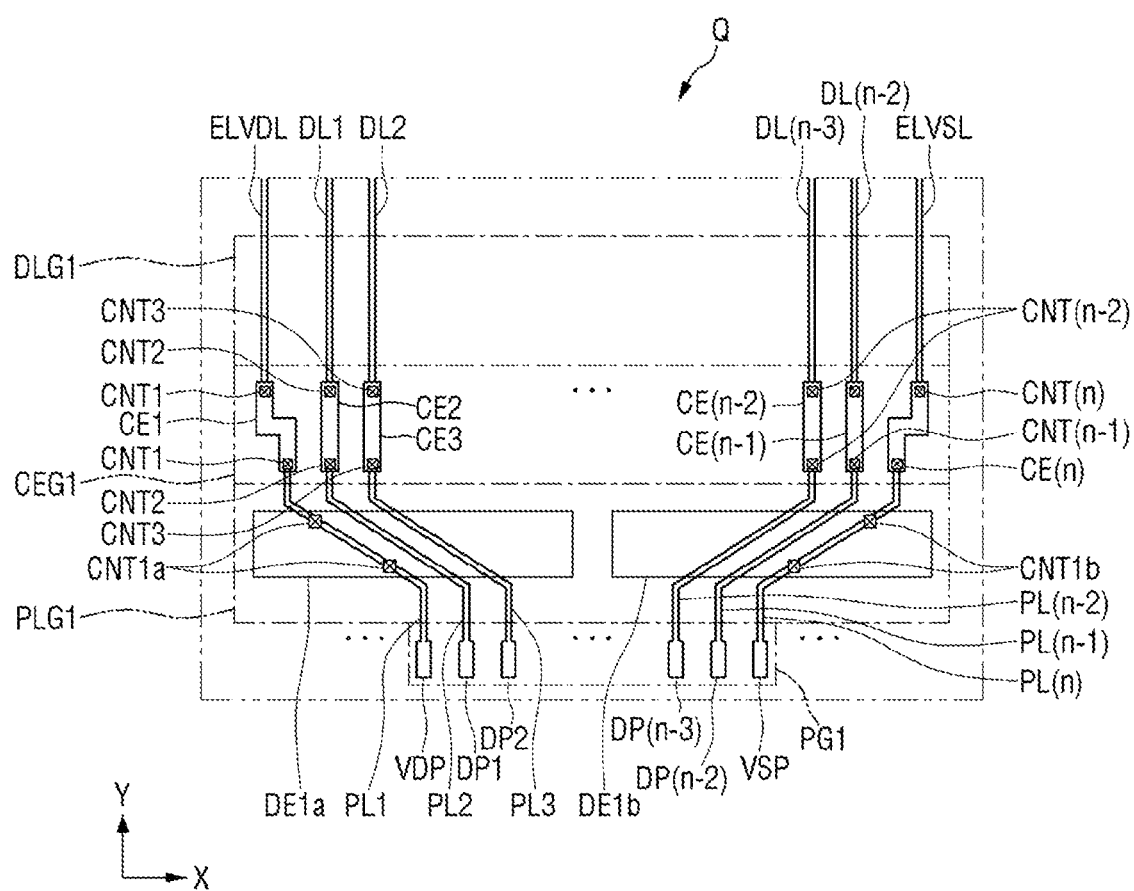
FIG. 6 is an enlarged view of the area Q of FIG. 2.
Figure 7:
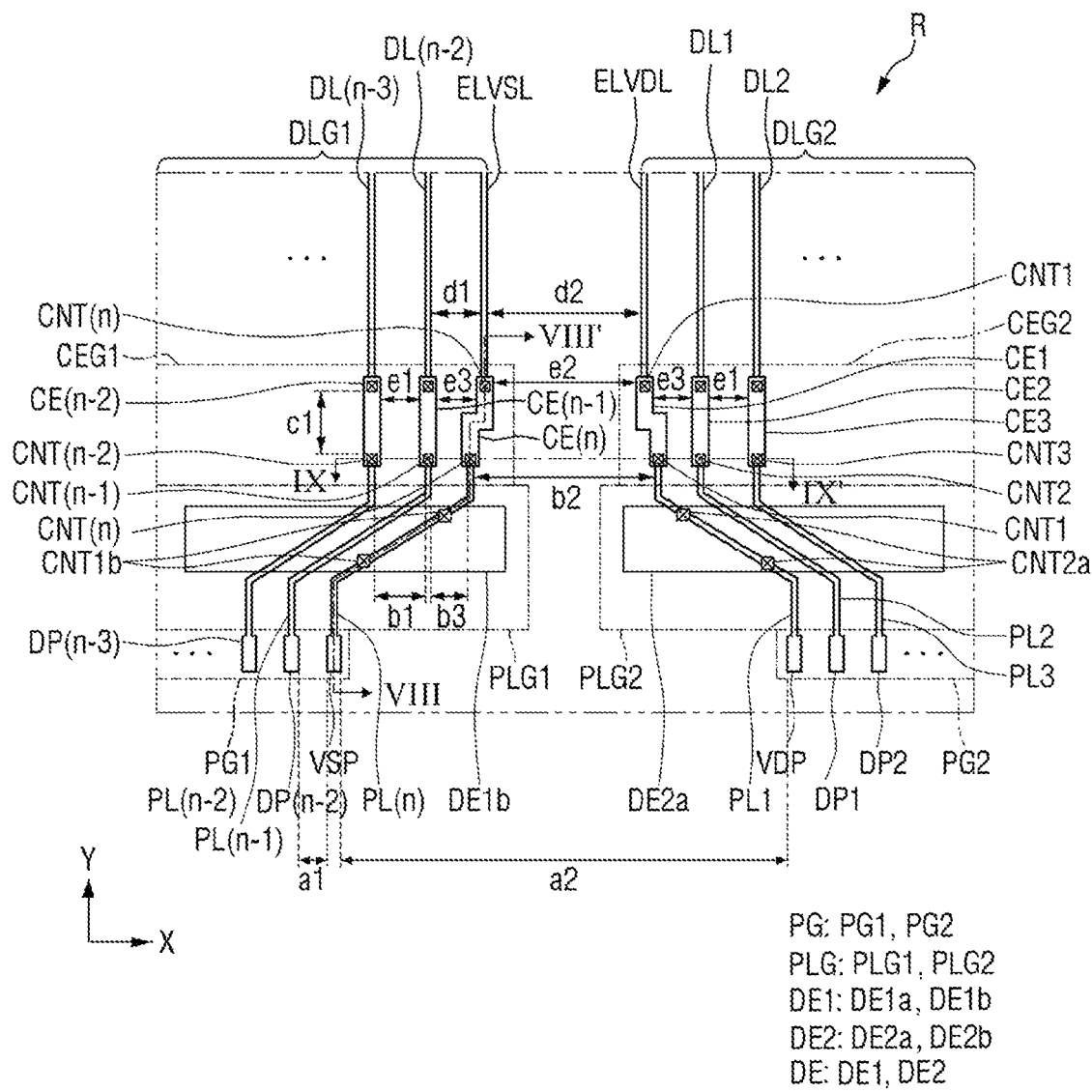
FIG. 7 is an enlarged view of the area R of FIG. 2.
Figure 8:
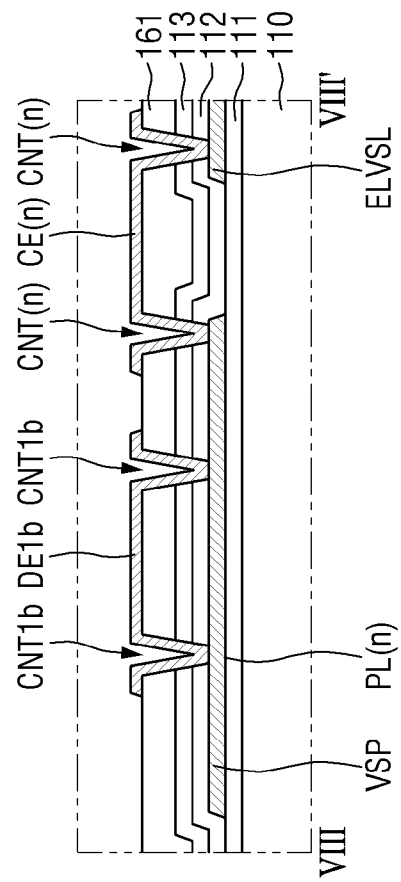
FIG. 8 is a cross-sectional view taken along the line VIII-VIII' of FIG. 7.
Figure 9:
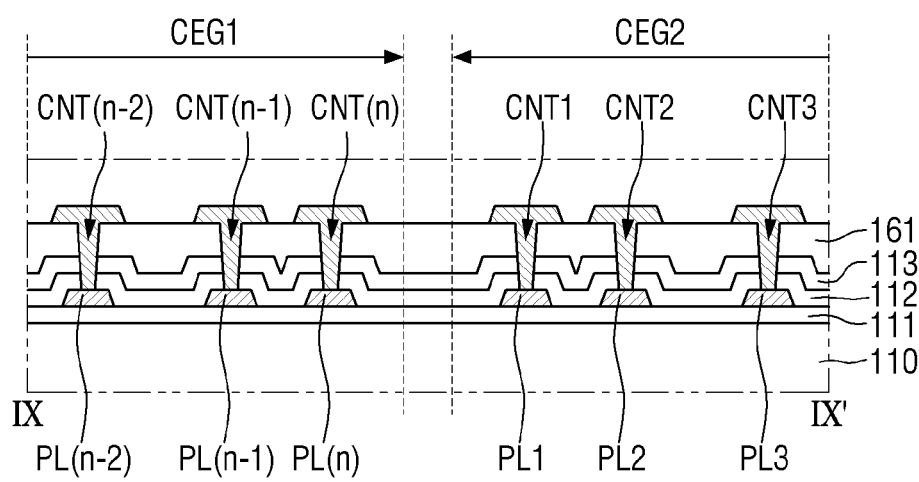
FIG. 9 is a cross-sectional view taken along the line IX-IX' of FIG. 7.

FIG. 6 is an enlarged view of the area Q of FIG. 2. FIG. 7 is an enlarged view of the area R of FIG. 2. FIG. 8 is a cross-sectional view taken along the line VIII-VIII' of FIG. 7. FIG. 9 is a cross-sectional view taken along the line IX-IX' of FIG. 7.

Referring to FIGS. 2 and 6 through 9, a fan-out line group PLG may include a plurality of fan-out lines PL. The fan-out lines PL may be arranged along the first direction X.

One fan-out line PL may extend from each pad PD included in a pad group PG. In other words, the number of pads PD included in a pad group PG and the number of fan-out lines PL included in a fan-out line group PLG extending from the pad group PG may be equal to each other.

However, the present disclosure is not limited thereto. When a pad group PG includes some pads PD from which no fan-out lines PL extend, the number of pads PD included in the pad group PG may be greater than the number of fan-out lines PL included in a fan-out line group PLG extending from the pad group PG.

A case where n fan-out lines PL are included in one fan-out line group PLG will be described in more detail below as an example. The fan-out line group PLG (e.g., PLG1) illustrated in FIG. 6 may include first through $n^{th}$ fan-out lines PL1 through PL(n), where n is a natural number greater than 1.

In the fan-out line group PLG, a distance between the $n^{th}$ fan-out line PL(n), which is an outermost fan-out line on the first side in the first direction X, and the first fan-out line PL1, which is an outermost fan-out line on the second side in the first direction X, may increase toward the first side in the second direction Y. A plurality of fan-out lines PL included in the fan-out line group PLG may be located further away from a virtual line, which extends in the second direction Y and bisects (e.g., a center of) the fan-out line group PLG, toward the first side in the second direction Y.

For example, in the fan-out line group PLG, fan-out lines PL disposed on a second side, in the first direction X, of the virtual line extending in the second direction Y and bisecting the fan-out line group PLG, may extend in a direction between the second side in the first direction X and the first side in the second direction Y.

In addition, in the fan-out line group PLG, fan-out lines PL disposed on a first side, in the first direction X, of the virtual line extending in the second direction Y and bisecting the fan-out line group PLG, may extend in a direction between the first side in the first direction X and the first side in the second direction Y. In other words, the fan-out lines on the second side of the virtual line may extend diagonally in a direction between the first and second directions X and Y, and the fan-out lines on the first side of the virtual line may be symmetrically or substantially symmetrically arranged with the fan-out lines on the second side of the virtual line relative to the virtual line.

However, the present disclosure is not limited thereto. In the fan-out line group PLG, some fan-out lines PL disposed adjacent to the virtual line extending in the second direction Y and bisecting the fan-out line group PLG may extend in the second direction Y. In addition, in the fan-out line group PLG, a degree to which each fan-out line PL is inclined from the virtual line extending in the second direction Y may increase toward the outside from the fan-out line group PLG.

In the display panel 10 according to the present embodiment, the first fan-out line PL1 may extend from a first power pad VDP, and the $n^{th}$ fan-out line PL(n) may extend from a second power pad VSP. The second through $(n-1)^{th}$ fan-out lines PL2 through PL$(n-1)^{th}$ may extend from the display pads DP.

A distance between the fan-out lines PL may be defined as a distance between first ends of the fan-out lines PL in the second direction Y. In one fan-out line group PLG, a distance b1 between each pair of neighboring fan-out lines PL may be the same or substantially the same as those of the others. However, in one fan-out line group PLG, a distance b3 between two neighboring fan-out lines PL, which are the two outermost fan-out lines on the first side in the first direction X and on the second side in the first direction X, may be smaller than or equal to the distance b1 between two neighboring fan-out lines PL disposed at (e.g., in or on) other areas. This will be described in more detail below.

A signal line group DLG may be spaced apart from a first side of each fan-out line group PLG in the second direction Y. The signal line group DLG may include a first power line ELVDL, a second power line ELVSL, and a plurality of data lines DL extending in the second direction Y. The lines included in the signal line group DLG will be described in more detail below based on the data lines DL. However, the same or substantially the same description may also be applied to the first power line ELVDL and the second power line ELVSL.

A distance d1 between each pair of neighboring data lines DL in one signal line group DLG may be the same or substantially the same. Also, a distance d2 between each pair of neighboring signal line groups DLG may be the same or substantially the same. In addition, the distance d1 between neighboring data lines DL in one signal line group DLG may be the same or substantially the same as the distance d2 between neighboring signal line groups DLG.

The distance d2 between neighboring signal line groups DLG may be smaller than the distance a2 between the first pad group PG1 and the second pad group PG2 described above.

The distance d2 between neighboring signal line groups DLG may refer to a distance between an outermost data line DL of a signal line group DPG on the first side in the first direction X and an outermost data line DL on the second side in the first direction X of another signal line group DLG disposed on a first side of the above signal line group DLG in the first direction X.

The number of data lines DL included in a signal line group DLG may be equal to the number of fan-out lines PL included in a fan-out line group PLG disposed on a second side of the signal line group DLG in the second direction Y. However, the present disclosure is not limited thereto, and the number of data lines DL included in the signal line group DLG may be different from the number of fan-out lines PL included in the fan-out line group PLG disposed on the second side of the signal line group DLG in the second direction Y.

Data lines DL included in a signal line group DLG may be aligned in the second direction Y with fan-out lines PL included in a fan-out line group PLG disposed on a second side of the signal line group DLG in the second direction Y. However, an outermost data line DL on the first side in the first direction X and an outmost data line DL on the second side in the first direction X in the signal line group DLG may not be aligned along the second direction Y with an outermost fan-out line PL on the first side in the first direction X and an outermost fan-out line PL on the second side in the first direction X in the fan-out line group PLG disposed on the second side of the signal line group DLG in the second direction Y. In more detail, a distance between an outermost data line DL on the first side in the first direction X and an outermost data line DL on the second side in the first direction X in one signal line group DLG may be greater than a distance between an outermost fan-out line PL on the first side in the first direction X and an outermost fan-out line PL on the second side in the first direction X in a fan-out line group PLG.

A signal line group DLG and a fan-out line group PLG disposed on a second side of the signal line group DLG in the second direction Y may be spaced apart from each other in the second direction Y. Ends of data lines DL included in the signal line group DLG and ends of fan-out lines PL included in the fan-out line group PLG disposed on the second side of the signal line group DLG in the second direction Y may face each other. Therefore, in some cases, an electrostatic discharge phenomenon may occur between the data lines DL and the fan-out lines PL in a process of manufacturing the display device 1. Because the electrostatic discharge phenomenon may damage various insulating layers and conductive layers included in the display device 1, it may be desirable to minimize or reduce the electrostatic discharge phenomenon. In an embodiment, to minimize or reduce the electrostatic discharge phenomenon, a sufficient distance may be secured between a signal line group DLG and a fan-out line group PLG. A distance c1 between a signal line group DLG and a fan-out line group PLG may be defined as a minimum distance in the second direction Y between second ends, in the second direction Y, of data lines DL included in the signal line group DLG and first ends, in the second direction Y, of fan-out lines PL included in the fan-out line group PLG.

The distance c1 between a signal line group DLG and a fan-out line group PLG may be about 280 μm or more. For example, the distance c1 between a data line DL included in a signal line group DLG and a fan-out line PL included in a fan-out line group PLG disposed on a second side of the signal line group DLG in the second direction Y may be about 280 μm or more.

A signal line group DLG and a fan-out line group PLG may be electrically connected to each other by a connection line group CEG. The connection line group CEG may include a plurality of connection lines CE. The connection lines CE may be arranged along the first direction X. The connection lines CE may include first through $n^{th}$ connection lines CE1 through CE(n), where n is a natural number greater than 1. The second through $(n-1)^{th}$ connection lines CE2 through CE(n-1) in the connection line group CEG may extend in the second direction Y. On the other hand, the first connection line CE1 and the $n^{th}$ connection line CE(n) which are the outermost connection lines on the first side in the first direction X and the second side in the first direction X in the connection line group CEG, may be partially bent.

In more detail, the first connection line CE1 may have an end connected to the first fan-out line PL1 through a first contact hole CNT1, and another end connected to a first power line ELVDL. The first connection line CE1 may extend from an end overlapping with the first fan-out line PL1 toward the first side in the second direction Y, may be bent toward the second side in the first direction X, and may extend again toward the first side in the second direction Y. Therefore, the other end of the first connection line CE1 may overlap with the first power line ELVDL.

In addition, the $n^{th}$ connection line CEL(n) may have an end connected to the $n^{th}$ fan-out line PL(n) through an $n^{th}$ contact hole CNT(n), and another end connected to a second power line ELVSL. The $n^{th}$ connection line CE(n) may extend from an end overlapping with the $n^{th}$ fan-out line PL(n) toward the first side in the second direction Y, may be bent toward the first side in the first direction X, and may extend again toward the first side in the second direction Y. Therefore, the other end of the $n^{th}$ connection line CE(n) may overlap with the second power line ELVSL.

In an embodiment, the first and $n^{th}$ fan-out lines PL1 and PL(n) connected to the first power pad VDP and the second power pad VSP, respectively, may be electrically connected to a dummy electrode DE through a plurality of contact holes CNT1a and CNT1b. The dummy electrode DE may reduce resistance of the first and $n^{th}$ fan-out lines PL1 and PL(n) to which the first power supply voltage and the second power supply voltage are applied. The dummy electrode DE may overlap with a fan-out line group PLG, but the present disclosure is not limited thereto.

Dummy electrodes DE may include a first dummy electrode DE1 overlapping with a first fan-out line group PLG1 and a second dummy electrode DE2 overlapping with a second fan-out line group PLG2. The first dummy electrode DE1 may include a $(1a)^{th}$ dummy electrode DE1a located on a second side, in the first direction X, of a virtual line extending in the second direction Y and bisecting the first fan-out line group PLG1, and a $(1b)^{th}$ dummy electrode DE1b located on a first side of the virtual line in the first direction X. The second dummy electrode DE2 may include a $(2a)^{th}$ dummy electrode DE2a located on a second side, in the first direction X, of a virtual line extending in the second direction Y and bisecting the second fan-out line group PLG2, and a $(2b)^{th}$ dummy electrode DE2b located on a first side of the virtual line in the first direction X.

The $(1a)^{th}$ dummy electrode DE1a may be electrically connected to the first fan-out line PL1 of the first fan-out line group PLG1 through a plurality of $(1a)^{th}$ contact holes CNT1a. The $(1a)^{th}$ contact holes CNT1a may be disposed on one side and another side, respectively, at (e.g., in or on) an area in which the $(1a)^{th}$ dummy electrode DE1a and the first fan-out line PL1 of the first fan-out line group PLG1 overlap with each other. The $(1b)^{th}$ dummy electrode DE1b may be electrically connected to the $n^{th}$ fan-out line PL(n) of the first fan-out line group PLG1 through a plurality of $(1b)^{th}$ contact holes CNT1b. The $(1b)^{th}$ contact holes CNT1b may be disposed on one side and another side, respectively, at (e.g., in or on) an area in which the $(1b)^{th}$ dummy electrode DE1b and the $n^{th}$ fan-out line PL(n) of the first fan-out line group PLG1 overlap with each other.

The $(2a)^{th}$ dummy electrode DE2a may be electrically connected to the first fan-out line PL1 of the second fan-out line group PLG2 through a plurality of $(2a)^{th}$ contact holes CNT2a. The $(2a)^{th}$ contact holes CNT2a may be disposed on one side and another side, respectively, at (e.g., in or on) an area in which the $(2a)^{th}$ dummy electrode DE2a and the first fan-out line PL1 of the second fan-out line group PLG2 overlap with each other. The $(2b)^{th}$ dummy electrode DE2b may be electrically connected to the $n^{th}$ fan-out line PL(n) of the second fan-out line group PLG2 through a plurality of $(2b)^{th}$ contact holes CNT2b. The $(2b)^{th}$ contact holes CNT2b may be disposed on one side and another side, respectively, at (e.g., in or on) an area in which the $(2b)^{th}$ dummy electrode DE2b and the $n^{th}$ fan-out line PL(n) of the second fan-out line group PLG2 overlap with each other.

The display panel 10 according to the present embodiment may include the first pad group PG1, the first fan-out line group PLG1 extending from the first pad group PG1, a first signal line group DLG1 spaced apart from a first side of the first fan-out line group PLG1 in the second direction Y, and a first connection line group CEG1 electrically connecting the first fan-out line group PLG1 and the first signal line group DLG1 to each other. In addition, the display panel 10 according to the present embodiment may include the second pad group PG2 disposed on a first side of the first pad group PG1 in the first direction X, the second fan-out line group PLG2 extending from the second pad group PG2, a second signal line group DLG2 spaced apart from a first side of the second fan-out line group PLG2 in the second direction Y, and a second connection line group CEG2 electrically connecting the second fan-out line group PLG2 and the second signal line group DLG2 to each other.

The first and second pad groups PG1 and PG2, the first and second fan-out line groups PLG1 and PLG2, and the first and second signal line groups DLG1 and DLG2 may be formed of (e.g., may be made of) the same conductive layer. For example, the first and second pad groups PG1 and PG2, the first and second fan-out line groups PLG1 and PLG, and the first and second signal line groups DLG1 and DLG2 may be formed from (e.g., may be made of) the first conductive layer 120. In other words, the first and second pad groups PG1 and PG2, the first and second fan-out line groups PLG1 and PLG2, and the first and second signal line groups DLG1 and DLG2 may be formed from (e.g., may be made of) the same layer as that of the light blocking pattern 121.

The first and second connection line groups CEG1 and CEG2 and the first and second dummy electrodes DE1 and DE2 may include (e.g., may be made of) the same conductive layer. For example, the first and second connection line groups CEG1 and CEG2 and the first and second dummy electrodes DE1 and DE2 may be formed from (e.g., may be made of) the third conductive layer 150. In other words, the first and second connection line groups CEG1 and CEG2 and the first and second dummy electrodes DE1 and DE2 may be formed from (e.g., may be made of) the same layer as that of the first source/drain electrode 151 and the second source/drain electrode 152.

In the first and second connection line groups CEG1 and CEG2, a distance e1 between each pair of neighboring connection lines CE may be the same or substantially the same. However, a distance e3 between the first connection line CE1 and the second connection line CE2 and/or a distance e3 between the $(n-1)^{th}$ connection line CE(n-1) and the $n^{th}$ connection line CE(n) may be different from the distance e1 between other connection lines CE. In more detail, the distance e3 between the first connection line CE1 and the second connection line CE2 and/or the distance e3 between the $(n-1)^{th}$ connection line CE(n-1) and the $n^{th}$ connection line CE(n) may be different from the distance e1 between other connection lines CE due to the shape of the first connection line CE1 and the $n^{th}$ connection line CE(n).

A minimum distance e2 between the first connection line group CEG1 and the second connection line group CEG2 may be defined as a minimum distance between the $n^{th}$ connection line CE(n) of the first connection line group CEG1 and the first connection line CE1 of the second connection line group CEG2.

A distance b2 between the first fan-out line group PLG1 and the second fan-out line group PLG2 neighboring (e.g., adjacent to) each other may be defined as a distance between a first end, in the second direction Y, of the $n^{th}$ fan-out line PL(n) disposed on the first side in the first direction X in one fan-out line group PLG, and a first end, in the second direction Y, of the first fan-out line PL1 disposed on the second side in the first direction X in another fan-out line group PLG adjacent to a first side of the fan-out line group PLG in the first direction X.

In the display panel 10 according to the present embodiment, when the distance b2 between the first fan-out line group PLG1 and the second fan-out line group PLG2 neighboring (e.g., adjacent to) each other is sufficient, the electrostatic discharge phenomenon occurring between the first fan-out line group PLG1 and the second fan-out line group PLG2 in the manufacturing process of the display device 1 may be minimized or reduced. Accordingly, damage to various conductive or insulating layers in the display panel 10 may be minimized or reduced, thereby improving the reliability of the display device 1.

The distance b2 between the first fan-out line group PLG1 and the second fan-out line group PLG2 neighboring each other may be greater than the distance d2 between the first signal line group DLG1 and the second signal line group DLG2 neighboring each other.

The distance b2 between the first fan-out line group PLG1 and the second fan-out line group PLG2 neighboring each other may be greater than or equal to the distance c1 between the first signal line group DLG1 and the first fan-out line group PLG1. For example, the distance b2 between the first fan-out line group PLG1 and the second fan-out line group PLG2 neighboring each other may be about 280 µm or more.

The distance b2 between the first fan-out line group PLG1 and the second fan-out line group PLG2 neighboring each other may be greater than or equal to the minimum distance e2 between the first connection line group CEG1 and the second connection line group CEG2.

In the display device 1 according to the present embodiment, the electrostatic discharge phenomenon occurring between the first fan-out line group PLG1 and the second fan-out line group PLG2 during the manufacturing process of the display device 1 may be minimized or reduced by securing a sufficient distance between the first fan-out line group PLG1 and the second fan-out line group PLG2. Accordingly, damage to various conductive layers and insulating layers of the display device 1 may be minimized or reduced, thereby improving the reliability of the display device 1.

Figure 10:
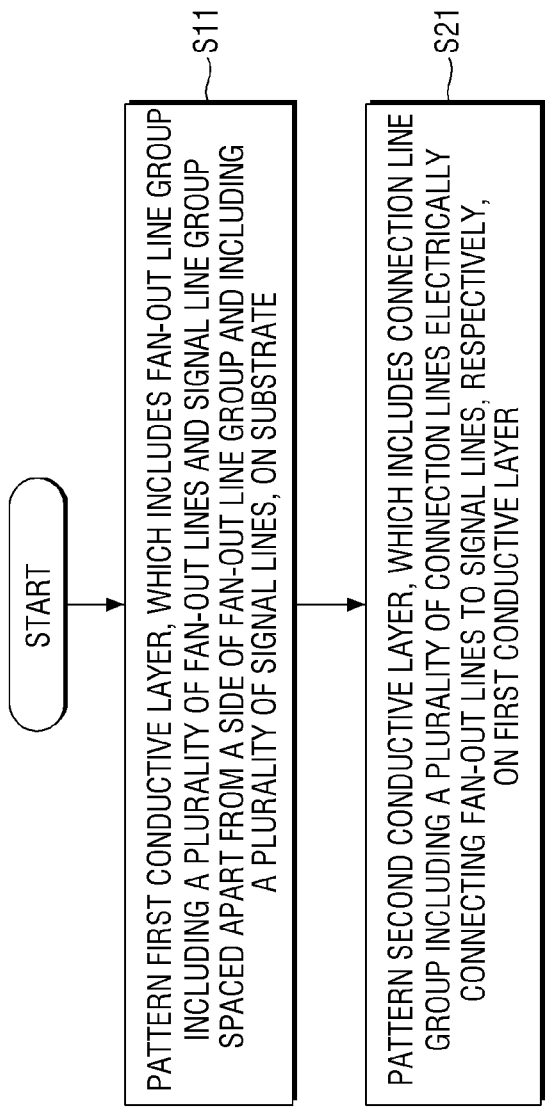
FIG. 10 is a flowchart illustrating a method of manufacturing a display device according to an embodiment.
Figure 11:
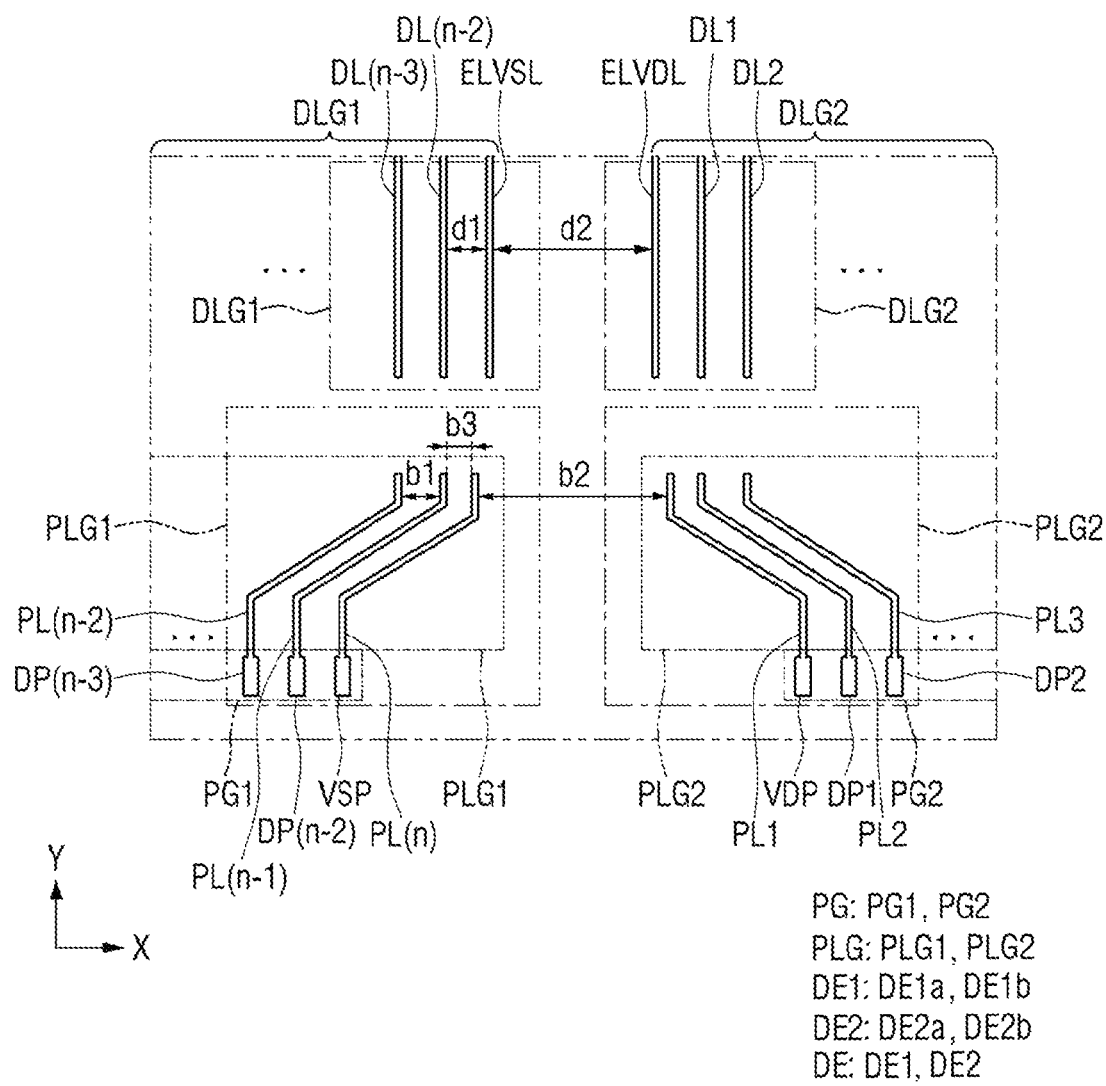
FIGS. 11-12 are schematic views illustrating various processes of the method of manufacturing the display device according to an embodiment.
Figure 12:
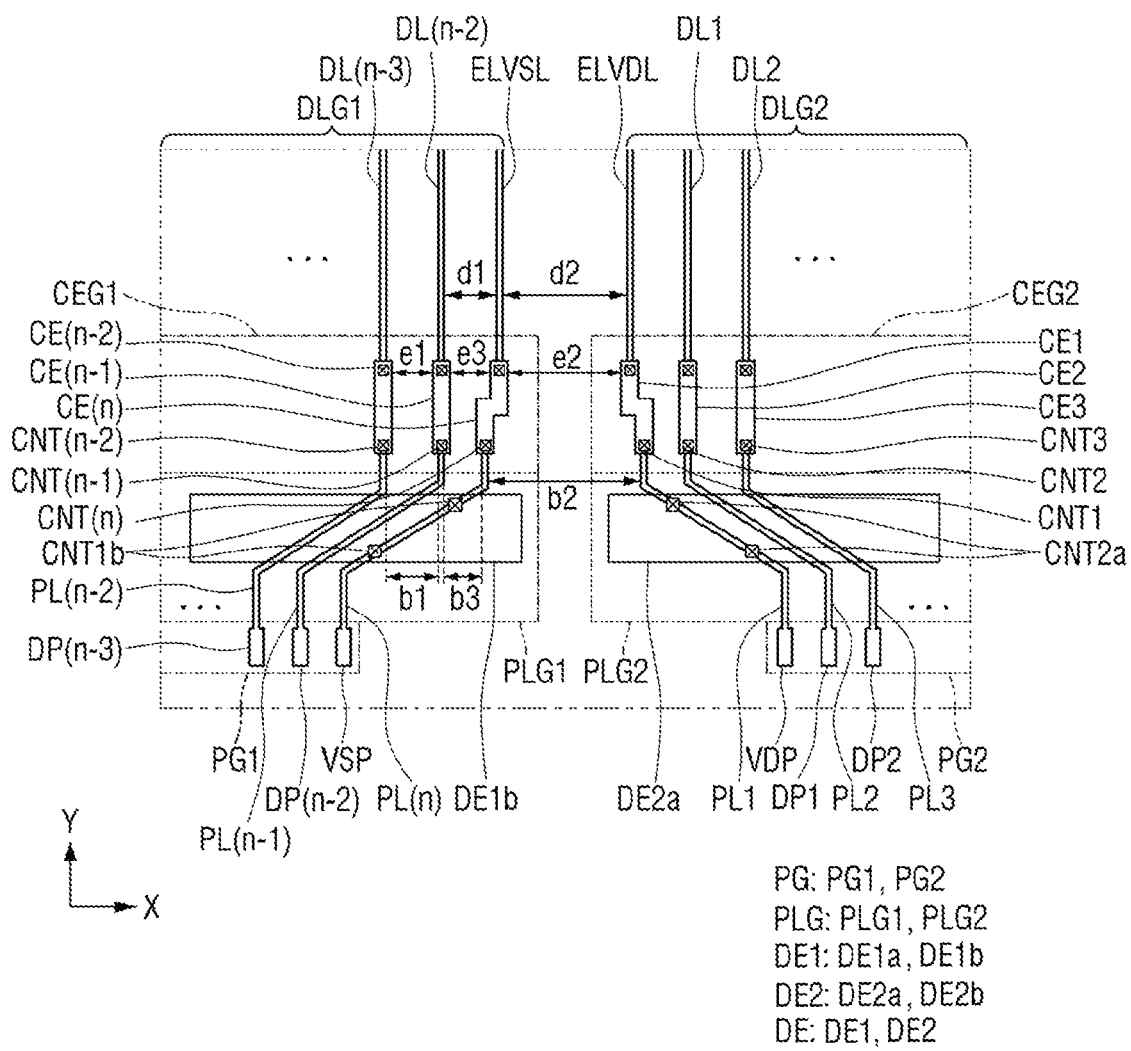

FIG. 10 is a flowchart illustrating a method of manufacturing a display device according to an embodiment. FIGS. 11 and 12 are schematic views illustrating various processes of the method of manufacturing the display device according to an embodiment.

Referring to FIG. 10, the method of manufacturing the display device according to the present embodiment may include patterning a first conductive layer, which includes a fan-out line group including a plurality of fan-out lines and a signal line group spaced apart from a side of the fan-out line group and including a plurality of signal lines, on a substrate (operation S11), and patterning a second conductive layer, which includes a connection line group including a plurality of connection lines electrically connecting the fan-out lines to the signal lines, respectively, on the first conductive layer (operation S21).

Referring to FIG. 11 in conjunction with FIG. 10, first, the patterning of the first conductive layer, which includes the fan-out line group including the fan-out lines and the signal line group spaced apart from the side of the fan-out line group and including the signal lines, on the substrate (operation S11) may be performed. Here, the substrate may include the first base substrate 110 and the barrier layer 111 disposed on the first base substrate 110 as described above with reference to FIG. 4.

A fan-out line group PLG may include a plurality of fan-out lines PL. For example, fan-out line groups PLG may include a first fan-out line group PLG1, and a second fan-out line group PLG2 disposed on a first side of the first fan-out line group PLG1 in the first direction X.

A signal line group DLG may include a first power line ELVDL, a second power line ELVSL, and a plurality of data lines DL. Signal line groups DLG may include a first signal line group DLG1 disposed on a first side of the first fan-out line group PLG1 in the second direction Y, and a second signal line group DLG2 disposed on a first side of the second fan-out line group PLG2 in the second direction Y.

A distance b2 between the first fan-out line group PLG1 and the second fan-out line group PLG2 may be greater than a distance between neighboring fan-out lines PL in the first fan-out line group PLG1.

Because the fan-out line groups PLG and the signal line groups DLG have been described above with reference to FIGS. 2 and 5 through 7, redundant description thereof may not be repeated.

Referring to FIG. 12 in conjunction with FIG. 10, the patterning of the second conductive layer, which includes the connection line group including the connection lines electrically connecting the fan-out lines to the signal lines, respectively, on the first conductive layer (operation S21) may be performed after the patterning of the first conductive layer, which includes the fan-out line group including the fan-out lines and the signal line group spaced apart from the side of the fan-out line group and including the signal lines, on the substrate (operation S11).

The patterning of the second conductive layer, which includes the connection line group including the connection lines electrically connecting the fan-out lines to the signal lines, respectively, on the first conductive layer (operation S21) may include patterning a first connection line group CEG1 electrically connecting the first fan-out line group PLG1 to the first signal line group DLG1, and a second connection line group CEG2 electrically connecting the second fan-out line group PLG2 to the second signal line group DLG2 on the first conductive layer 120 (e.g., see FIG. 4).

The distance b2 between the first fan-out line group PLG1 and the second fan-out line group PLG2 may be greater than a minimum distance e2 between the first connection line group CEG1 and the second connection line group CEG2.

Because the connection line groups CEG have been described above with reference to FIGS. 2 and 5 through 7, redundant description thereof may not be repeated.

In the method of manufacturing the display device 1 according to the present embodiment, an electrostatic discharge phenomenon occurring between the first fan-out line group PLG1 and the second fan-out line group PLG2 during the manufacturing process of the display device 1 may be minimized or reduced by securing a sufficient distance between the first fan-out line group PLG1 and the second fan-out line group PLG2. Accordingly, damage to various conductive layers and insulating layers of the display device 1 may be minimized or reduced, thereby improving the reliability of the display device 1.

One or more other embodiments of the display device 1 will now be described in more detail hereinafter. In the following description of display devices according to one or more other embodiments, redundant description as those of the one or more embodiments described above may not be repeated, and the differences from the display device 1 according to the one or more embodiments described above may be mainly described.

Figure 13:
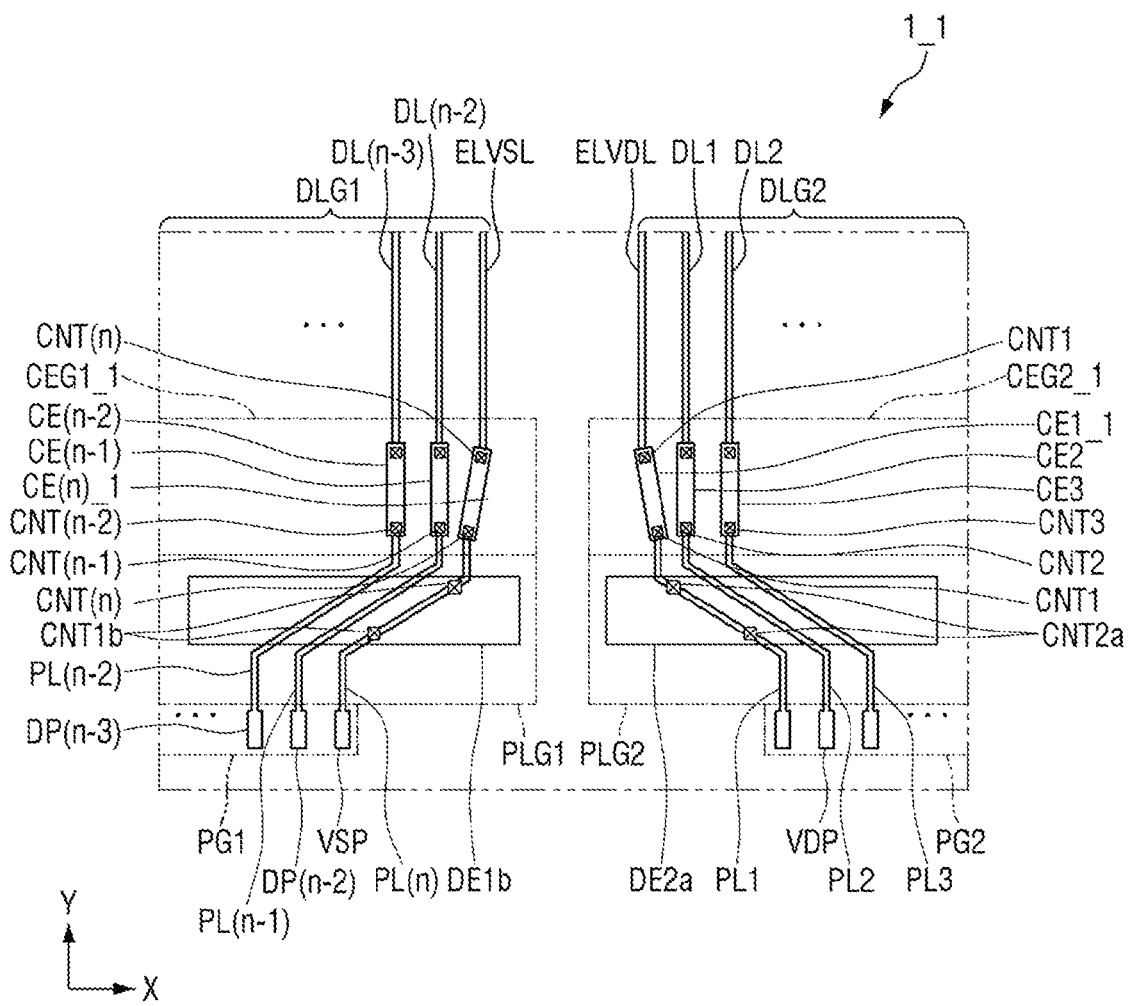
FIG. 13 is a partial layout view of a display device according to an embodiment.

FIG. 13 is a partial layout view of a display device 1_1 according to an embodiment.

Referring to FIG. 13, the display device 1_1 according to the present embodiment may be different from the display device 1 according to the embodiment of FIG. 7, in that an $n^{th}$ connection line CE(n)_1 of a first connection line group CEG1_1 extends in a direction, and a first connection line CE1_1 of a second connection line group CEG2_1 extends in another direction.

In the present embodiment, the $n^{th}$ connection line CE(n)_1 of the first connection line group CEG1_1 and the first connection line CE1_1 of the second connection line group CEG2_1 may slope toward each other. In more detail, the $n^{th}$ connection line CE(n)_1 of the first connection line group CEG1_1 may extend in a direction between the first side in the first direction X and the first side in the second direction Y. In addition, the first connection line CE1_1 of the second connection line group CEG2_1 may extend in a direction between the second side in the first direction X and the first side in the second direction Y.

In the current embodiment, other connection lines CE except for the $n^{th}$ connection line CE(n)_1 of the first connection line group CEG1_1 and the first connection line CE1_1 of the second connection line group CEG2_1 may extend in the second direction Y.

In the display device 1_1 according to the present embodiment, an electrostatic discharge phenomenon occurring between a first fan-out line group PLG1 and a second fan-out line group PLG2 during a process of manufacturing the display device 1_1 may be minimized or reduced by securing a sufficient distance between the first fan-out line group PLG1 and the second fan-out line group PLG2. Accordingly, damage to various conductive layers and insulating layers of the display device 1_1 may be minimized or reduced, thereby improving the reliability of the display device 1_1.

Furthermore, because the display device 1_1 according to the present embodiment includes the $n^{th}$ connection line CE(n)_1 of the first connection line group CEG1_1 that extends in a direction and the first connection line CE1_1 of the second connection line group CEG2_1 that extends in another direction, the connection lines CE may be formed more easily.

Figure 14:
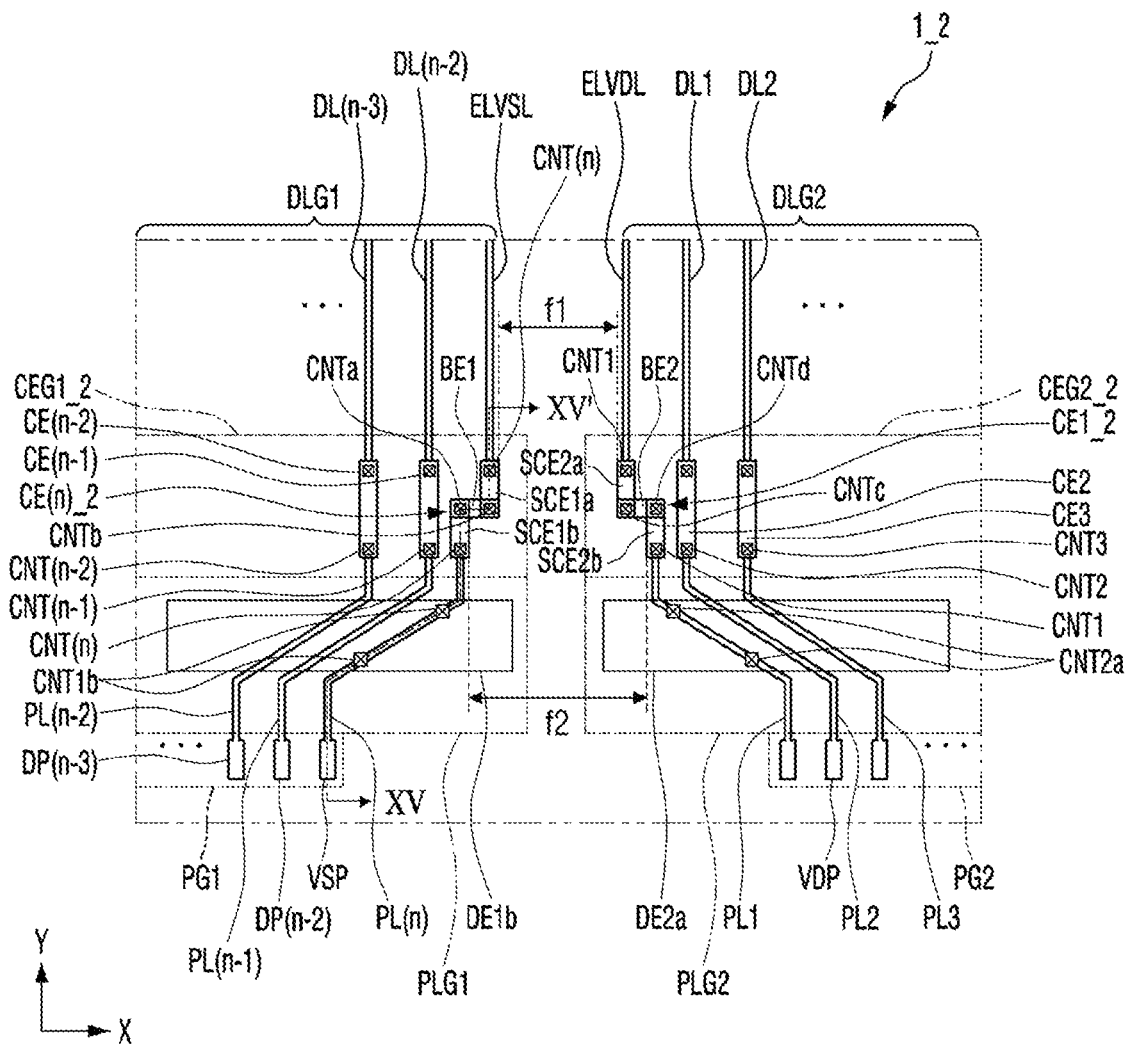
FIG. 14 is a partial layout view of a display device according to an embodiment.
Figure 15:
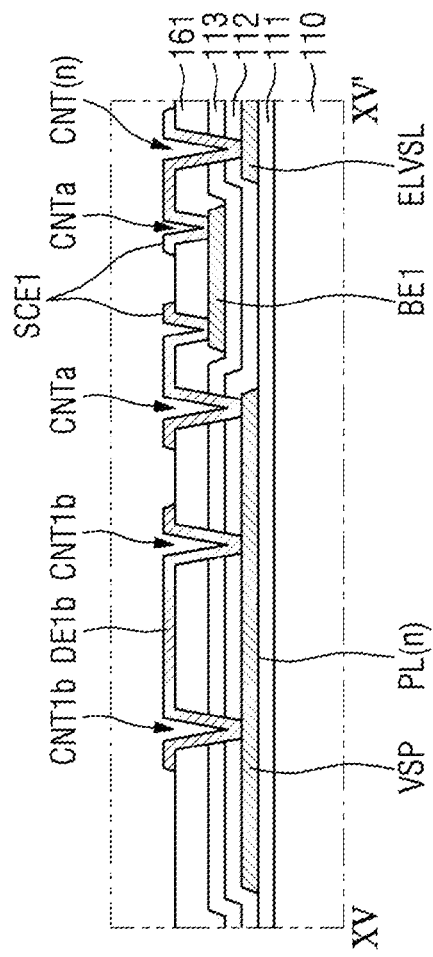
FIG. 15 is a cross-sectional view taken along the line XV-XV' of FIG. 14.

FIG. 14 is a partial layout view of a display device 1_2 according to an embodiment. FIG. 15 is a cross-sectional view taken along the line XV-XV' of FIG. 14.

Referring to FIG. 14, the display device 1_2 according to the present embodiment may be different from the display device 1 according to the embodiment of FIG. 7, in that each of an $n^{th}$ connection line CE(n)_2 of a first connection line group CEG1_2 and a first connection line CE1_2 of a second connection line group CEG2_2 includes sub-connection lines SCE extending in a direction, and further includes a bridge line BE electrically connecting the sub-connection lines SCE to one another.

In the present embodiment, the $n^{th}$ connection line CE(n)_2 of the first connection line group CEG1_2 may include a first sub-connection line SCE1a and a second sub-connection line SCE1b, which extend in the second direction Y, are spaced apart from each other, and are alternately disposed. The first sub-connection line SCE1a and the second sub-connection line SCE1b may not overlap with each other, and may be arranged in the first direction X.

The first connection line CE1_2 of the second connection line group CEG2_2 may include a third sub-connection line SCE2a and a fourth sub-connection line SCE2b, which extend in the second direction Y, are spaced apart from each other, and are alternately disposed. The third sub-connection line SCE2a and the fourth sub-connection line SCE2b may not overlap with each other, and may be arranged in the first direction X.

The bridge lines BE may include a first bridge line BE1 disposed in the first connection line group CEG1_2, and a second bridge line BE2 disposed in the second connection line group CEG2_2.

The first sub-connection line SCE1a may have an end electrically connected to a first power line ELVSL, and another end electrically connected to the first bridge line BE1. The second sub-connection line SCE1b may have an end electrically connected to an $n^{th}$ fan-out line PL(n) of a first fan-out line group PLG1, and another end electrically connected to the first bridge line BE1.

The bridge lines BE may extend in the first direction X. The bridge lines BE may be formed from (e.g., may be made of) a different conductive layer from that of the connection line groups CEG. For example, the bridge lines BE may be formed from (e.g., may be made of) the second conductive layer 140 described above with reference to FIG. 4. In other words, the bridge lines BE may be formed from (e.g., may be made of) the same conductive layer as that of the gate electrode 141 (e.g., see FIG. 4). The resistance of the $n^{th}$ connection line CE(n)_2 of the first connection line group CEG1_2 and the first connection line CE1_2 of the second connection line group CEG2_2 may be variously adjusted by changing the cross-sectional area and/or material of the bridge lines BE.

In the display device 1_2 according to the present embodiment, an electrostatic discharge phenomenon occurring between the first fan-out line group PLG1 and the second fan-out line group PLG2 during a process of manufacturing the display device 1_2 may be minimized or reduced by securing a sufficient distance between the first fan-out line group PLG1 and the second fan-out line group PLG2. Accordingly, damage to various conductive layers and insulating layers of the display device 1_2 may be minimized or reduced, thereby improving the reliability of the display device 1_2.

Furthermore, in the display device 1_2 according to the present embodiment, because each of the $n^{th}$ connection line CE(n)_2 of the first connection line group CEG1_2 and the first connection line CE1_2 of the second connection line group CEG2_2 includes a plurality of sub-connection lines SCE extending in a direction, and the sub-connection lines SCE are electrically connected to one another by a bridge line BE, the resistance of the $n^{th}$ connection line CE(n)_2 of the first connection line group CEG1_2 and the first connection line CE1_2 of the second connection line group CEG2_2 may be adjusted as needed or desired.

Figure 16:
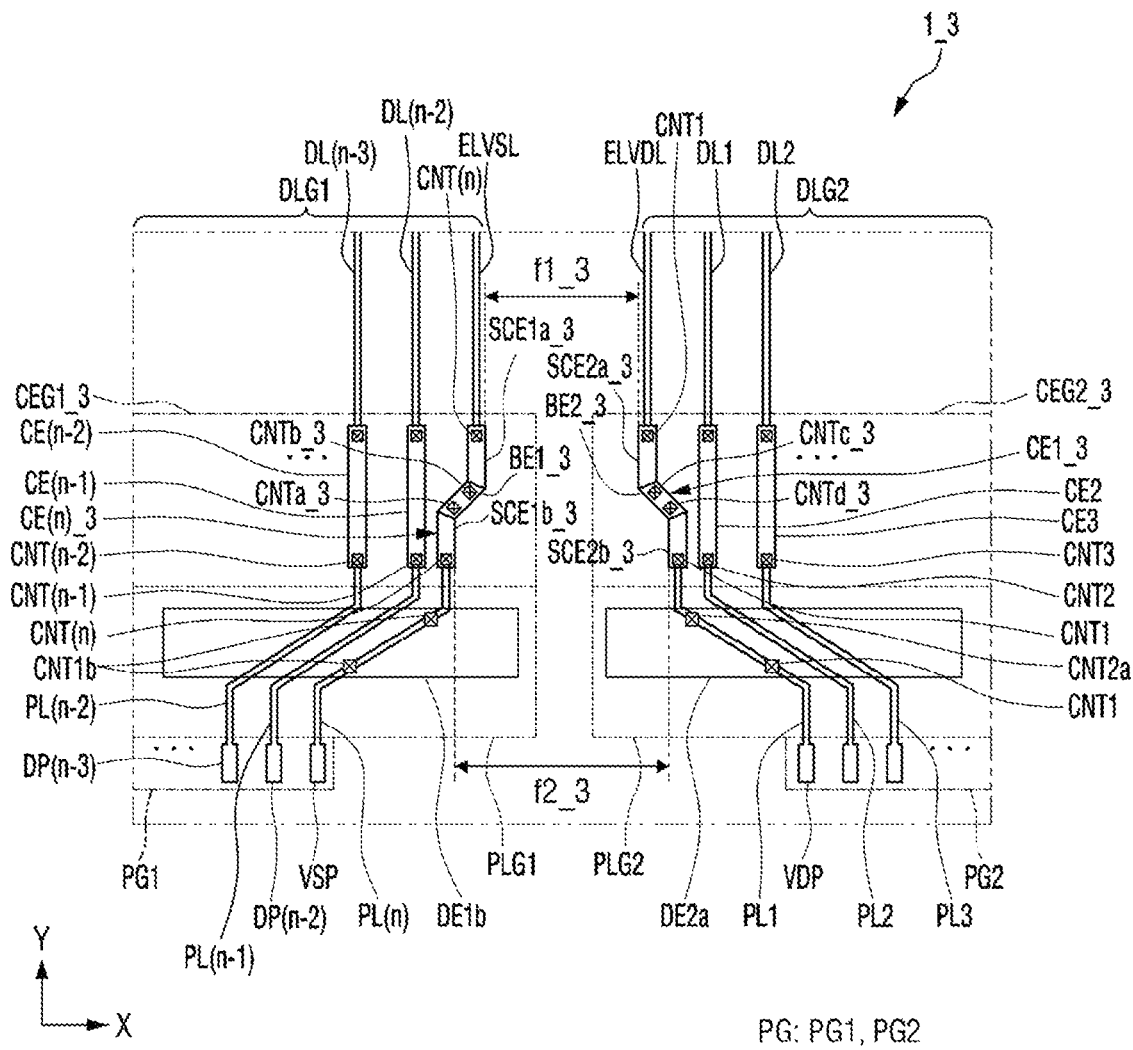
FIG. 16 is a partial layout view of a display device according to an embodiment.

FIG. 16 is a partial layout view of a display device 1_3 according to an embodiment.

Referring to FIG. 16, the display device 1_3 according to the present embodiment may be different from the display device 1_2 according to the embodiment of FIG. 15, in that the bridge lines BE_3 are inclined. In more detail, a bridge line BE_3 of a first connection line group CEG1_3 may extend in a direction between the first side in the first direction X and the first side in the second direction Y. In addition, a bridge line BE_3 of a second connection line group CEG2_3 may extend in a direction between the second side in the first direction X and the first side in the second direction Y.

In the display device 1_3 according to the present embodiment, an electrostatic discharge phenomenon occurring between a first fan-out line group PLG1 and a second fan-out line group PLG2 during a process of manufacturing the display device 1_3 may be minimized or reduced by securing a sufficient distance between the first fan-out line group PLG1 and the second fan-out line group PLG2. Accordingly, damage to various conductive layers and insulating layers of the display device 1_3 may be minimized or reduced, thereby improving the reliability of the display device 1_3.

Furthermore, in the display device 1_3 according to the present embodiment, because each of the $n^{th}$ connection line CE(n)_3 of the first connection line group CEG1_3 and the first connection line CE1_3 of the second connection line group CEG2_3 includes a plurality of sub-connection lines SCE extending in a direction, and the sub-connection lines SCE are electrically connected to one another by a bridge line BE, the resistance of the $n^{th}$ connection line CE(n)_3 of the first connection line group CEG1_3 and the first connection line CE1_3 of the second connection line group CEG2_3 may be adjusted as needed or desired.

Figure 17:
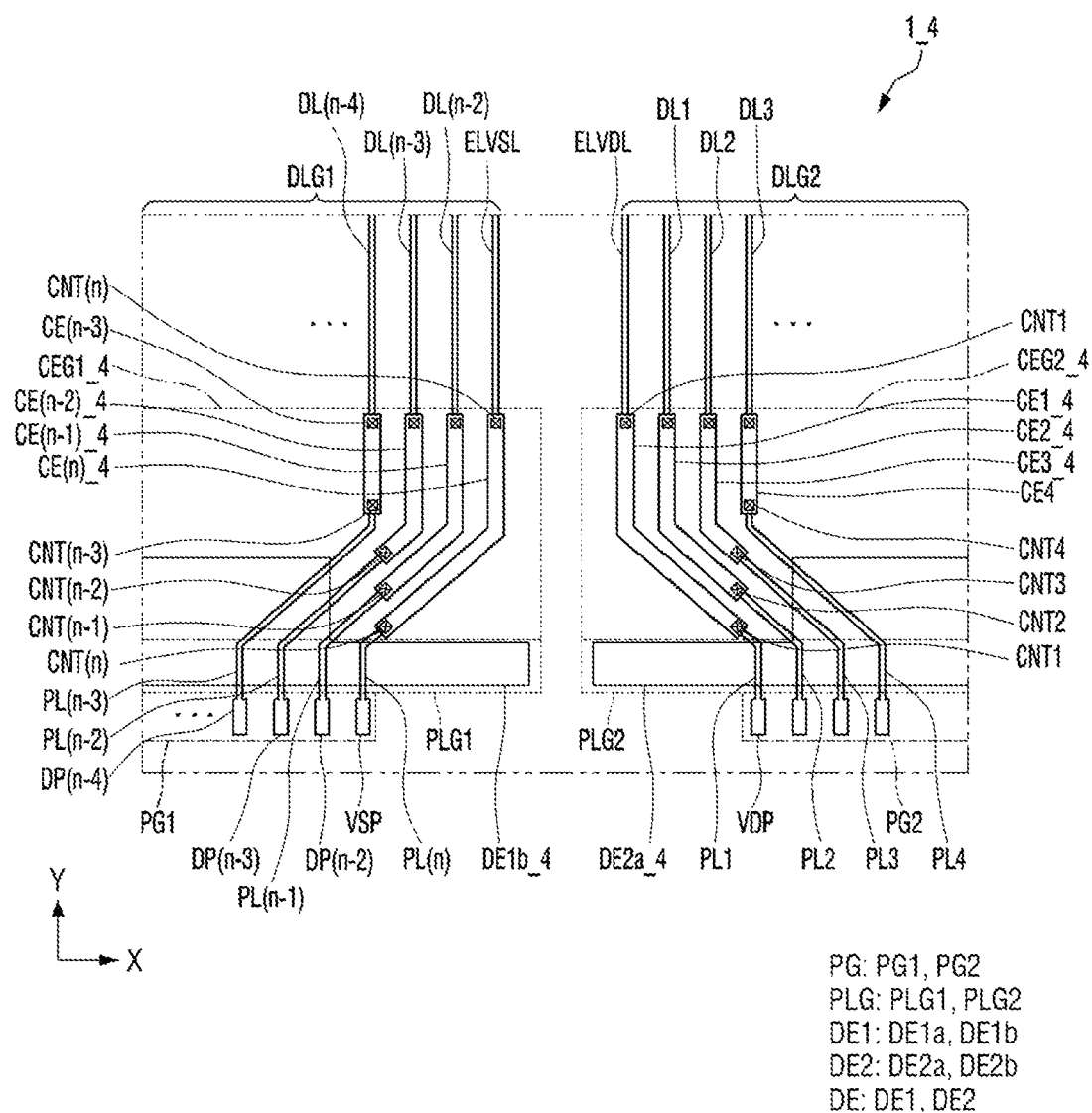
FIG. 17 is a partial layout view of a display device according to an embodiment.

FIG. 17 is a partial layout view of a display device 1_4 according to an embodiment.

Referring to FIG. 17, the display device 1_4 according to the present embodiment may be different from the display device 1 according to the embodiment of FIG. 7, in that a space is secured between a first fan-out line group PLG1 and a second fan-out line group PLG2 through bent connection lines CE.

In the display device 1_4 according to the present embodiment, ends of $(n-2)^{th}$ through $n^{th}$ fan-out lines PL(n-2) through PL(n), which are outermost fan-out lines on the first side in the first direction X in the first fan-out line group PLG1, may be aligned in the second direction Y. The $(n-2)^{th}$ through $n^{th}$ fan-out lines PL(n-2) through PL(n) of the first fan-out line group PLG1 may be electrically connected to ends of $(n-2)^{th}$ through $n^{th}$ connection lines CE(n-2)_4 through CE(n)_4, respectively, of a first connection line group CEG1_4.

Each of the $(n-2)^{th}$ through $n^{th}$ connection lines CE(n-2)_4 through CE(n)_4 of the first connection line group CEG1_4 may extend in a direction between the first side in the first direction X and the first side in the second direction Y, may be bent, and then may extend in the second direction Y. A distance between the $(n-2)^{th}$ through $n^{th}$ connection lines CE(n-2)_4 through CE(n)_4 of the first connection line group CEG1_4 may be the same or substantially the same as each other in each area.

The other ends of the $(n-2)^{th}$ through $n^{th}$ connection lines CE(n-2)_4 through CE(n)_4 of the first connection line group CEG1_4 may be electrically connected to $(n-3)^{th}$ and $(n-2)^{th}$ data lines DL(n-3) and DL(n-2) and a second power line ELVSL, respectively, of a first signal line group DLG1.

In addition, ends of first through third fan-out lines PL1 through PL3, which are outermost fan-out lines on the second side in the first direction X in the second fan-out line group PLG2, may be aligned in the second direction Y. The first through third fan-out lines PL1 through PL3 of the second fan-out line group PLG2 may be electrically connected to ends of first through third connection lines CE1_4 through CE3_4, respectively, of a second connection line group CEG2_4.

Each of the first through third connection lines CE1_4 through CE3_4 of the second connection line group CEG2_4 may extend in a direction between the second side in the first direction X and the first side in the second direction Y, may be bent, and then may extend in the second direction Y. A distance between the first through third connection lines CE1_4 through CE3_4 of the second connection line group CEG2_4 may be the same or substantially the same as each other in each area.

The other ends of the first through third connection lines CE1_4 through CE3_4 of the second connection line group CEG2_4 may be electrically connected to a first power line ELVDL and first and second data lines DL1 and DL2, respectively, of a second signal line group DLG2.

In the current embodiment, a $(1b)^{th}$ dummy electrode DE1b_4 and a $(2a)^{th}$ dummy electrode DE2a_4 may have a shape exposing the connection lines CE. For example, the $(1b)^{th}$ dummy electrode DE1b_4 may have a '[' shape overlapping with the first fan-out line group PLG1. The $(2a)^{th}$ dummy electrode DE2a_4 may be symmetrical or substantially symmetrical to the $(1b)^{th}$ dummy electrode DE1b_4 to overlap with the second fan-out line group PLG2.

In the display device 1_4 according to the present embodiment, an electrostatic discharge phenomenon occurring between the first fan-out line group PLG1 and the second fan-out line group PLG2 during a process of manufacturing the display device 1_4 may be minimized or reduced by securing a sufficient distance between the first fan-out line group PLG1 and the second fan-out line group PLG2. Accordingly, damage to various conductive layers and insulating layers of the display device 1_4 may be minimized or reduced, thereby improving the reliability of the display device 1_4.

Furthermore, in the display device 1_4 according to the present embodiment, because the distance between the first fan-out line group PLG1 and the second fan-out line group PLG2 is further increased by reducing the length of the fan-out lines PL and increasing the length of the connection lines CE, the electrostatic discharge phenomenon occurring during the process of manufacturing the display device 1_4 may be dramatically reduced.

Figure 18:
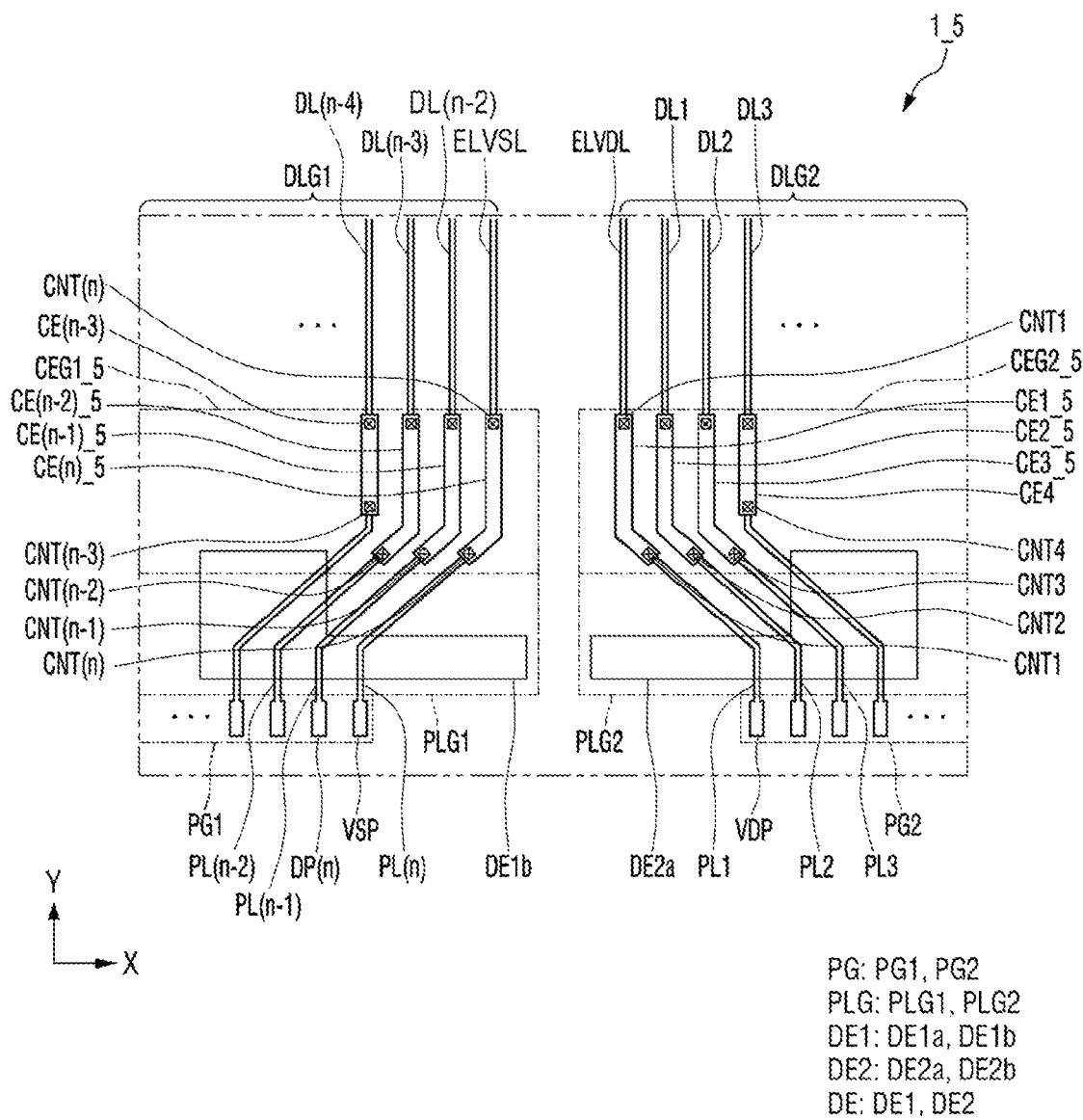
FIG. 18 is a partial layout view of a display device according to an embodiment.

FIG. 18 is a partial layout view of a display device 1_5 according to an embodiment.

Referring to FIG. 18, the display device 1_5 according to the present embodiment may be different from the display device 1_4 according to the embodiment of FIG. 17, in that ends of the $(n-2)^{th}$ through $n^{th}$ fan-out lines PL(n-2) through PL(n), which are outermost fan-out lines on the first side in the first direction X in a first fan-out line group PLG1, are aligned in the first direction X. The $(n-2)^{th}$ through $n^{th}$ fan-out lines PL(n-2) through PL(n) of the first fan-out line group PLG1 may be electrically connected to ends of $(n-2)^{th}$ through $n^{th}$ connection lines CE(n-2)_5 through CE(n)_5, respectively, of a first connection line group CEG1_5.

In addition, ends of first through third fan-out lines PL1 through PL3, which are outermost fan-out lines on the second side in the first direction X in a second fan-out line group PLG2, may be aligned in the first direction X. The first through third fan-out lines PL1 through PL3 of the second fan-out line group PLG2 may be electrically connected to ends of first through third connection lines CE1_5 through CE3_5, respectively, of a second connection line group CEG2_5.

In the display device 1_5 according to the present embodiment, an electrostatic discharge phenomenon occurring between the first fan-out line group PLG1 and the second fan-out line group PLG2 during a process of manufacturing the display device 1_5 may be minimized or reduced by securing a sufficient distance between the first fan-out line group PLG1 and the second fan-out line group PLG2. Accordingly, damage to various conductive layers and insulating layers of the display device 1_5 may be minimized or reduced, thereby improving the reliability of the display device 1_5.

Furthermore, in the display device 1_5 according to the present embodiment, because the distance between the first fan-out line group PLG1 and the second fan-out line group PLG2 is further increased by reducing the length of the fan-out lines PL and increasing the length of the connection lines CE, the electrostatic discharge phenomenon occurring during the process of manufacturing the display device 1_5 may be dramatically reduced.

Figure 19:
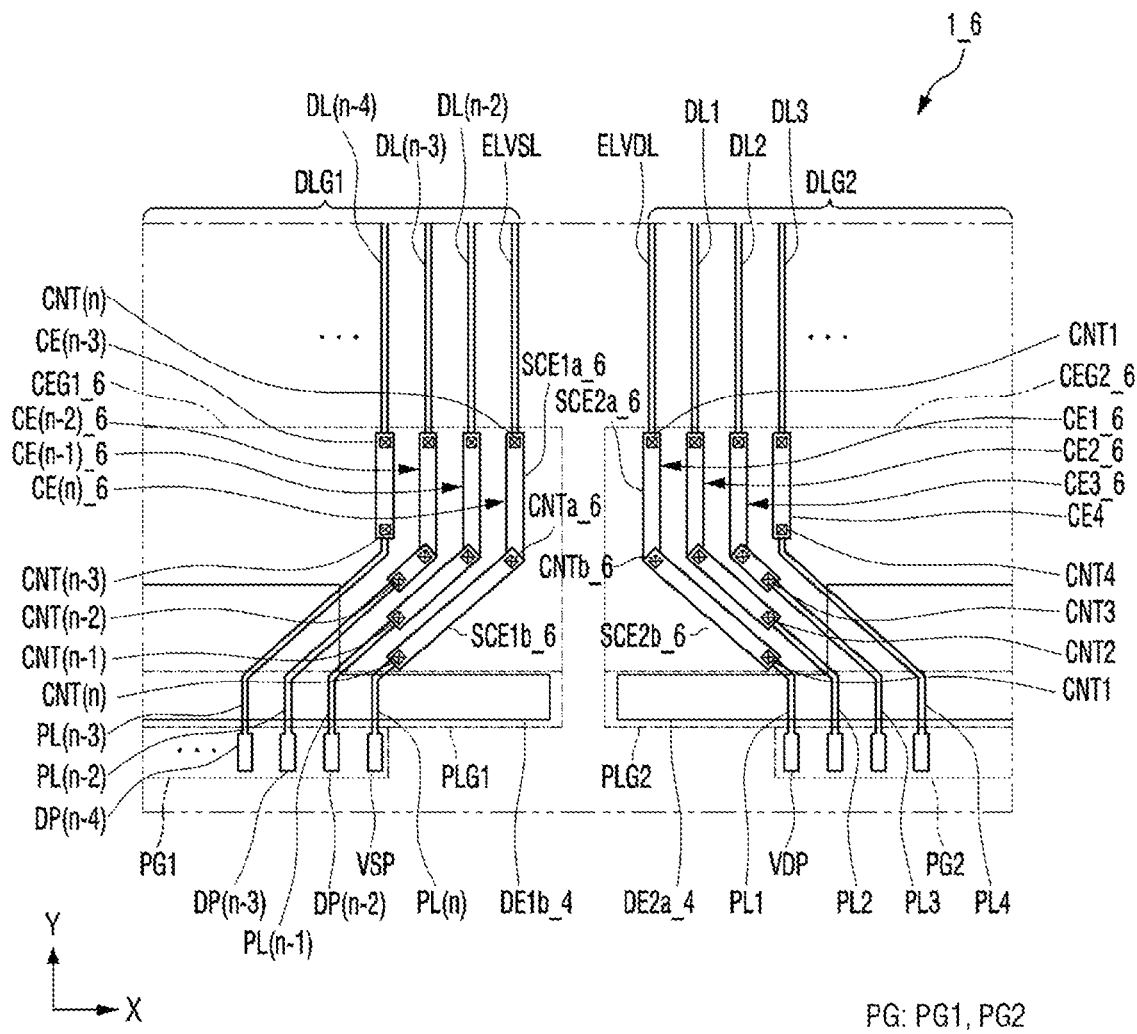
FIG. 19 is a partial layout view of a display device according to an embodiment.

FIG. 19 is a partial layout view of a display device 1_6 according to an embodiment.

Referring to FIG. 19, the display device 1_6 according to the present embodiment may be different from the display device 1_4 according to the embodiment described above with reference to FIG. 17, in that each of the $(n-2)^{th}$ through $n^{th}$ connection lines CE(n-2)_6 through CE(n)_6 of a first connection line group CEG1_6 electrically connecting (n-2)$^{th}$ through n$^{th}$ fan-out lines PL(n-2) through PL(n), which are outermost fan-out lines on the first side in the first direction X in a first fan-out line group PLG1 and have ends aligned in the second direction Y, to $(n-3)^{th}$ and $(n-2)^{th}$ data lines DL(n-3) and DL(n-2) and a second power line ELVSL, respectively, of a first signal line group DLG1, includes a plurality of sub-connection lines SCE1a_6 and SCE1b_6.

The sub-connection lines SCE1a_6 and SCE1b_6 included in each of the $(n-2)^{th}$ through $n^{th}$ connection lines CE(n-2)_6 through CE(n)_6 of the first connection line group CEG1_6 may include a first sub-connection line SCE1a_6 connected to the first signal line group DLG1 and a second sub-connection line SCE1b_6 connected to the first fan-out line group PLG1.

The first sub-connection lines SCE1a_6 and the second sub-connection lines SCE1b_6 included in the first connection line group CEG1_6 may be formed from (e.g., may be made of) different conductive layers from each other. For example, the first sub-connection lines SCE1a_6 may be formed from (e.g., may be made of) the second conductive layer 140 described above with reference to FIG. 4, and the second sub-connection lines SCE1b_6 may be formed from (e.g., may be made of) the third conductive layer 150 described above with reference to FIG. 4. As another example, the first sub-connection lines SCE1a_6 may be formed from (e.g., may be made of) the third conductive layer 150, and the second sub-connection lines SCE1b_6 may be formed from (e.g., may be made of) the second conductive layer 140. However, the present disclosure is not limited thereto, and the first sub-connection lines SCE1a_6 and the second sub-connection lines SCE1b_6 may be formed from (e.g., may be made of) other suitable conductive layers in the display device 1_6.

Each pair of the first sub-connection line SCE1a_6 and the second sub-connection line SCE1b_6 included in the first connection line group CEG1_6 may be electrically connected to each other by a first sub-contact hole CNTa_6.

In addition, the display device 1_6 according to the present embodiment may be different from the display device 1_4 according to the embodiment described above with reference to FIG. 17, in that each of first through third connection lines CE1_6 through CE3_6 of a second connection line group CEG2_6 electrically connecting first through third fan-out lines PL1 through PL3, which are outermost fan-out lines on the second side in the first direction X in a second fan-out line group PLG2 and have ends aligned in the second direction Y, to a first power line ELVDL and first and second data lines DL1 and DL2, respectively, of a second signal line group DLG2, includes a plurality of sub-connection lines SCE2a_6 and SCE2b_6.

The sub-connection lines SCE2a_6 and SCE2b_6 included in each of the first through third connection lines CE1_6 through CE3_6 of the second connection line group CEG2_6 may include a third sub-connection line SCE2a_6 connected to the second signal line group DLG2 and a fourth sub-connection line SCE2b_6 connected to the second fan-out line group PLG2.

The third sub-connection lines SCE2a_6 and the fourth sub-connection lines SCE2b_6 included in the second connection line group CEG2_6 may be formed from (e.g., may be made of) different conductive layers from each other. For example, the third sub-connection lines SCE2a_6 may be formed from (e.g., may be made of) the second conductive layer 140 described above with reference to FIG. 4, and the fourth sub-connection lines SCE2b_6 may be formed from (e.g., may be made of) the third conductive layer 150 described above with reference to FIG. 4. As another example, the third sub-connection lines SCE2a_6 may be formed from (e.g., may be made of) the third conductive layer 150, and the fourth sub-connection lines SCE2b_6 may be formed from (e.g., may be made of) the second conductive layer 140. However, the present disclosure is not limited thereto, and the third sub-connection lines SCE2a_6 and the fourth sub-connection lines SCE2b_6 may be formed from (e.g., may be made of) other suitable conductive layers in the display device 1_6.

Each pair of the third sub-connection line SCE2a_6 and the fourth sub-connection line SCE2b_6 included in the second connection line group CEG2_6 may be electrically connected to each other by a second sub-contact hole CNTb_6.

In the display device 1_6 according to the present embodiment, the resistance of the $(n-2)^{th}$ through $n^{th}$ connection lines CE(n-2)_6 through CE(n)_6 of the first connection line group CEG1_6 and the first through third connection lines CE1_6 through CE3_6 of the second connection line group CEG2_6 may be variously adjusted by changing the cross-sectional area and/or material of the first through fourth sub-connection lines SCE1a_6, SCE1b_6, SCE2a_6, and SCE2b_6.

In the display device 1_6 according to the present embodiment, an electrostatic discharge phenomenon occurring between the first fan-out line group PLG1 and the second fan-out line group PLG2 during a process of manufacturing the display device 1_6 may be minimized or reduced by securing a sufficient distance between the first fan-out line group PLG1 and the second fan-out line group PLG2. Accordingly, damage to various conductive layers and insulating layers of the display device 1_6 may be minimized or reduced, thereby improving the reliability of the display device 1_6.

Furthermore, in the display device 1_6 according to the present embodiment, the resistance of the $(n-2)^{th}$ through $n^{th}$ connection lines CE(n−2)_6 through CE(n)_6 of the first connection line group CEG1_6 and the first through third connection lines CE1_6 through CE3_6 of the second connection line group CEG2_6 may be variously adjusted through the first and second sub-connection lines SCE1a_6 and SCE1b_6 and the third and fourth sub-connection lines SCE2a_6 and SCE2b_6, which are formed from (e.g., made of) different conductive layers from each other, and electrically connected through the first and second sub-contact holes CNTa_6 and CNTb_6, respectively.

Figure 20:
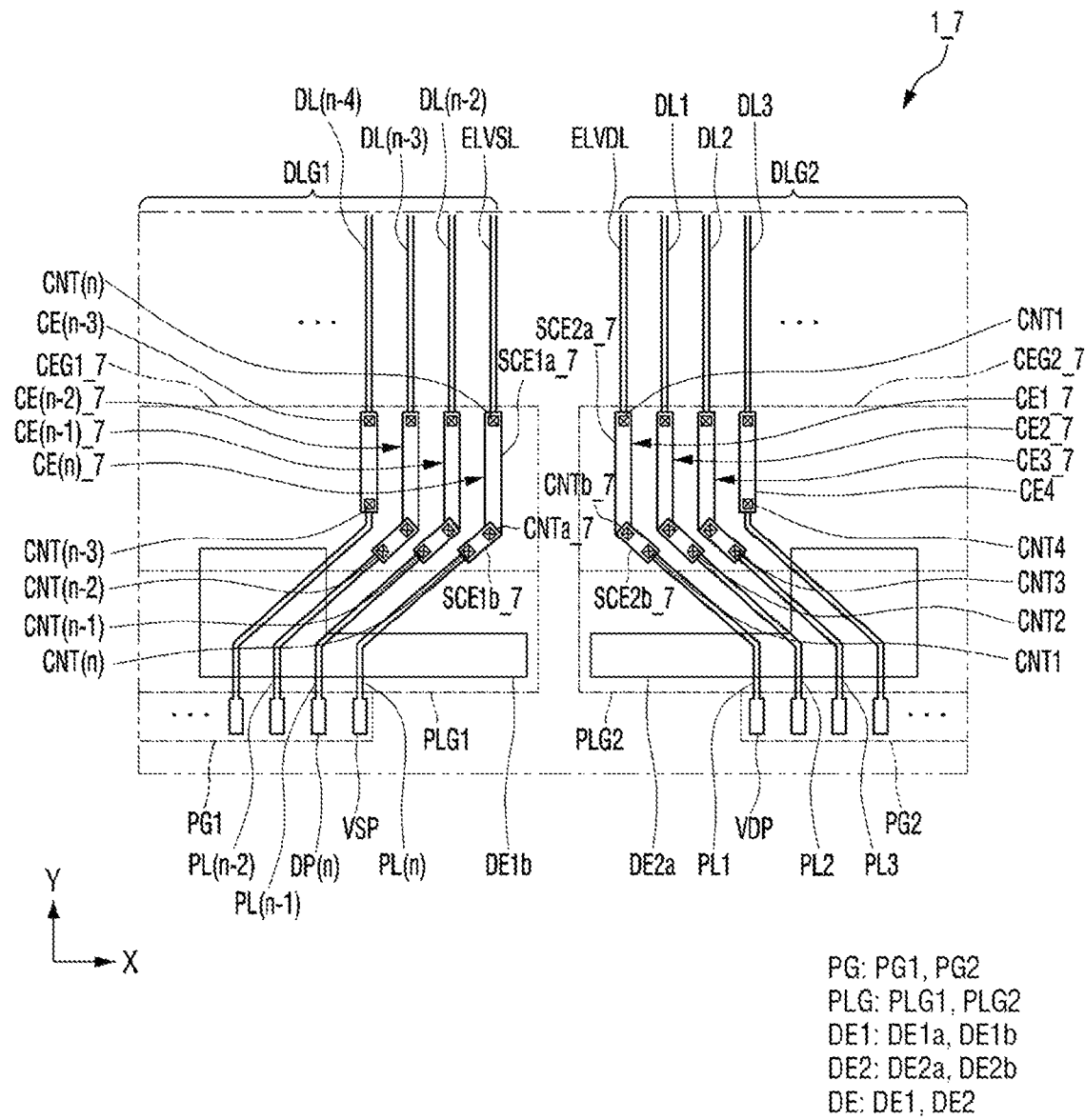
FIG. 20 is a partial layout view of a display device according to an embodiment.

FIG. 20 is a partial layout view of a display device 1_7 according to an embodiment.

Referring to FIG. 20, the display device 1_7 according to the present embodiment may be different from the display device 1_4 according to the embodiment described above with reference to FIG. 17, in that each of the $(n-2)^{th}$ through $n^{th}$ connection lines CE(n−2)_7 through CE(n)_7 of a first connection line group CEG1_7 electrically connecting $(n-2)^{th}$ through $n^{th}$ fan-out lines PL(n−2) through PL(n), which are outermost fan-out lines on the first side in the first direction X in a first fan-out line group PLG1 and have ends aligned in the first direction X, to $(n-3)^{th}$ and $(n-2)^{th}$ data lines DL(n−3) and DL(n−2) and a second power line ELVSL of a first signal line group DLG1, respectively, includes a plurality of sub-connection lines SCE1a_7 and SCE1b_7.

The sub-connection lines SCE1a_7 and SCE1b_7 included in each of the $(n-2)^{th}$ through $n^{th}$ connection lines CE(n−2)_7 through CE(n)_7 of the first connection line group CEG1_7 may include a first sub-connection line SCE1a_7 connected to the first signal line group DLG1, and a second sub-connection line SCE1b_7 connected to the first fan-out line group PLG1.

The first sub-connection lines SCE1a_7 and the second sub-connection lines SCE1b_7 included in the first connection line group CEG1_7 may be formed from (e.g., may be made of) different conductive layers from each other. For example, the first sub-connection lines SCE1a_7 may be formed from (e.g., may be made of) the second conductive layer 140 described above with reference to FIG. 4, and the second sub-connection lines SCE1b_7 may be formed from (e.g., may be made of) the third conductive layer 150 described above with reference to FIG. 4. As another example, the first sub-connection lines SCE1a_7 may be formed from (e.g., may be made of) the third conductive layer 150, and the second sub-connection lines SCE1b_7 may be formed from (e.g., may be made of) the second conductive layer 140. However, the present disclosure is not limited thereto, and the first sub-connection lines SCE1a_7 and the second sub-connection lines SCE1b_7 may be formed from (e.g., may be made of) other suitable conductive layers in the display device 1_7.

Each pair of the first sub-connection line SCE1a_7 and the second sub-connection line SCE1b_7 included in the first connection line group CEG1_7 may be electrically connected to each other by a first sub-contact hole CNTa_7.

In addition, the display device 1_7 according to the present embodiment may be different from the display device 1_4 according to the embodiment described above with reference to FIG. 17, in that each of first through third connection lines CE1_7 through CE3_7 of a second connection line group CEG2_7 electrically connecting first through third fan-out lines PL1 through PL3, which are outermost fan-out lines on the second side in the first direction X in a second fan-out line group PLG2 and have ends aligned in the first direction X, to a first power line ELVDL and first and second data lines DL1 and DL2 of a second signal line group DLG2, respectively, includes a plurality of sub-connection lines SCE2a_7 and SCE2b_7.

The sub-connection lines SCE2a_7 and SCE2b_7 included in each of the first through third connection lines CE1_7 through CE3_7 of the second connection line group CEG2_7 may include a third sub-connection line SCE2a_7 connected to the second signal line group DLG2, and a fourth sub-connection line SCE2b_7 connected to the second fan-out line group PLG2.

The third sub-connection lines SCE2a_7 and the fourth sub-connection lines SCE2b_7 included in the second connection line group CEG2_7 may be formed from (e.g., may be made of) different conductive layers from each other. For example, the third sub-connection lines SCE2a_7 may be formed from (e.g., may be made of) the second conductive layer 140 described above with reference to FIG. 4, and the fourth sub-connection lines SCE2b_7 may be formed from (e.g., may be made of) the third conductive layer 150 described above with reference to FIG. 4. As another example, the third sub-connection lines SCE2a_7 may be formed from (e.g., may be made of) the third conductive layer 150, and the fourth sub-connection lines SCE2b_7 may be formed from (e.g., may be made of) the second conductive layer 140. However, the present disclosure is not limited thereto, and the third sub-connection lines SCE2a_7 and the fourth sub-connection lines SCE2b_7 may be formed from (e.g., may be made of) other suitable conductive layers in the display device 1_7.

Each pair of the third sub-connection line SCE2a_7 and the fourth sub-connection line SCE2b_7 included in the second connection line group CEG2_7 may be electrically connected to each other by a second sub-contact hole CNTb_7.

In the display device 1_7 according to the present embodiment, the resistance of the $(n-2)^{th}$ through $n^{th}$ connection lines CE(n−2)_7 through CE(n)_7 of the first connection line group CEG1_7 and the first through third connection lines CE1_7 through CE3_7 of the second connection line group CEG2_7 may be variously adjusted by changing the cross-sectional area and/or material of the first through fourth sub-connection lines SCE1a_7, SCE1b_7, SCE2a_7 and SCE2b_7.

In the display device 1_7 according to the present embodiment, an electrostatic discharge phenomenon occurring between the first fan-out line group PLG1 and the second fan-out line group PLG2 during a process of manufacturing the display device 1_7 may be minimized or reduced by securing a sufficient distance between the first fan-out line group PLG1 and the second fan-out line group PLG2. Accordingly, damage to various conductive layers and insulating layers of the display device 1_7 may be minimized or reduced, thereby improving the reliability of the display device 1_7.

Furthermore, in the display device 1_7 according to the present embodiment, the resistance of the $(n-2)^{th}$ through $n^{th}$ connection lines CE(n−2)_7 through CE(n)_7 of the first connection line group CEG1_7 and the first through third connection lines CE1_7 through CE3_7 of the second connection line group CEG2_7 may be variously adjusted through the first and second sub-connection lines SCE1a_7 and SCE1b_7 and the third and fourth sub-connection lines SCE2a_7 and SCE2b_7, which are formed from (e.g., made of) different conductive layers from each other and electrically connected through the first and second sub-contact holes CNTa_7 and CNTb_7, respectively.

A display device according to one or more embodiments of the present disclosure includes a plurality of fan-out line groups, each of the fan-out line groups including a plurality of fan-out lines. An electrostatic discharge phenomenon occurring during a process of manufacturing the display device may be reduced by increasing a distance between neighboring (e.g., adjacent ones of the) fan-out line groups. Accordingly, noise that may be generated in the display device may be reduced, thereby improving the reliability of the display device.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
    a substrate;
    a plurality of fan-out lines on the substrate;
    a plurality of signal lines on the substrate, and spaced from the fan-out lines; and
    a plurality of connection lines connecting the fan-out lines to the signal lines, respectively, and located at a different layer from those of the fan-out lines and the signal lines,
    wherein the fan-out lines comprise:
        a plurality of first fan-out lines of a first fan-out group; and
        a plurality of second fan-out lines of a second fan-out group, the first fan-out group and the second fan-out group being adjacent to each other,
        wherein an outermost first fan-out line of the first fan-out group that is located closest to the second fan-out group and an outermost second fan-out line of the second fan-out group that is located closest to the first fan-out group are connected to signal lines from among the plurality of signal lines, respectively, and
        wherein a distance between the outermost first fan-out line and the outermost second fan-out line is greater than a distance between the signal lines respectively connected to the outermost first fan-out line and the outermost second fan-out line.

2. The display device of claim 1, wherein the distance between the outermost first fan-out line and the outermost second fan-out line is greater than a distance between adjacent ones of the first fan-out lines in the first fan-out group.

3. The display device of claim 1, wherein the distance between the outermost first fan-out line and the outermost second fan-out line is greater than or equal to a distance between connection lines from among the plurality of connection lines respectively connected to the outermost first fan-out line and the outermost second fan-out line.

4. The display device of claim 1, wherein a distance between outermost neighboring first fan-out lines in the first fan-out group is smaller than or equal to a distance between neighboring first fan-out lines in the first fan-out group.

5. The display device of claim 1, wherein the plurality of connection lines comprise:
    a plurality of first connection lines electrically connecting the plurality of first fan-out lines to corresponding ones of the plurality of signal lines; and
    a plurality of second connection lines electrically connecting the plurality of second fan-out lines to corresponding ones of the plurality of signal lines.

6. The display device of claim 5, wherein one of the first connection lines comprises:
    a first sub-connection line electrically connected to a corresponding first fan-out line of the plurality of first fan-out lines;
    a second sub-connection line electrically connected to a corresponding signal line from among the plurality of signal lines; and
    a third sub-connection line electrically connecting the first sub-connection line and the second sub-connection line to each other.

7. The display device of claim 6, wherein the third sub-connection line extends in a first direction, and the first sub-connection line and the second sub-connection line extend in a second direction different from the first direction.

8. The display device of claim 5, wherein the distance between the outermost first fan-out line and the outermost second fan-out line is greater than a distance between a first connection line from among the plurality of first connection lines and a second connection line from among the plurality of second connection lines respectively connected to the outermost first fan-out line and the outermost second fan-out line.

9. The display device of claim 5, wherein ends of at least two neighboring first fan-out lines in the first fan-out group are aligned with each other along a direction in which the signal lines extend.

10. A display device comprising:
    a substrate;
    a first conductive layer on the substrate, and comprising:
        a first fan-out group comprising a plurality of first fan-out lines:
        a second fan-out group comprising a plurality of second fan-out lines at a side of the first fan-out group in a first direction;
        a first signal group comprising a plurality of first signal lines spaced from the first fan-out group in a second direction crossing the first direction; and
        a second signal group comprising a plurality of second signal lines spaced from the second fan-out group in the second direction; and
    a second conductive layer on the first conductive layer, and different from the first conductive layer, the second conductive layer comprising:
        a plurality of first connection lines electrically connecting the first fan-out lines to the first signal lines; and
        a plurality of second connection lines electrically connecting the second fan-out lines to the second signal lines, wherein a distance between the first fan-out group and the second fan-out group is greater than a distance between the first connection lines and the second connection lines.

11. The display device of claim 10, wherein the distance between the first fan-out group and the second fan-out group is greater than a distance between the first signal group and the second signal group.

12. The display device of claim 10, wherein the distance between the first fan-out group and the second fan-out group is greater than a distance between neighboring ones of the first fan-out lines in the first fan-out group.

13. The display device of claim 10, wherein the distance between the first fan-out group and the second fan-out group is greater than or equal to a distance between the first signal group and the first fan-out group.

14. The display device of claim 10, wherein a distance between two outermost neighboring first fan-out lines in the first fan-out group is smaller than or equal to the distance between neighboring first fan-out lines in the first fan-out group.

15. The display device of claim 10, further comprising:
a third conductive layer between the first conductive layer and the second conductive layer,
wherein one of the first connection lines comprises:
a first sub-connection line electrically connected to a corresponding first fan-out line from among the plurality of first fan-out lines; and
a second sub-connection line electrically connected to a corresponding first signal line from among the plurality of first signal lines, and
wherein the third conductive layer comprises a third connection line electrically connecting the first sub-connection line and the second sub-connection line to each other.

16. The display device of claim 15, wherein the first sub-connection line and the second sub-connection line extend in the second direction, and the third connection line extends in the first direction.

17. The display device of claim 10, wherein ends of at least two first fan-out lines in the first fan-out group are aligned with each other along the second direction.

18. A display device comprising:
a substrate;
a plurality of fan-out lines on the substrate;
a plurality of signal lines on the substrate, and spaced from the fan-out lines; and
a plurality of connection lines connecting the fan-out lines to the signal lines, respectively, and located at a different layer from those of the fan-out lines and the signal lines,
wherein the fan-out lines comprise:
a plurality of first fan-out lines of a first fan-out group; and
a plurality of second fan-out lines of a second fan-out group,
wherein the first fan-out lines in the first fan-out group comprise an outermost first fan-out line located closest to the second fan-out group, and the second fan-out lines in the second fan-out group comprise an outermost second fan-out line located closest to the first fan-out group,
wherein the signal lines comprise:
an outermost first signal line connected to the outermost first fan-out line; and
an outermost second signal line connected to the outermost second fan-out line,
wherein the connection lines comprise:
an outermost first connection line connecting the outermost first fan-out line to the outermost first signal line; and
an outermost second connection line connecting the outermost second fan-out line to the outermost second signal line,
wherein the outermost first connection line comprises:
a first sub-connection line connected to the outermost first fan-out line;
a second sub-connection line connected to the outermost first signal line; and
a third sub-connection line connecting the first sub-connection line and the second sub-connection line to each other,
wherein the outermost second connection line comprises:
a fourth sub-connection line connected to the outermost second fan-out line;
a fifth sub-connection line connected to the outermost second signal line; and
a sixth sub-connection line connecting the fourth sub-connection line and the fifth sub-connection line to each other, and
wherein a distance between the first sub-connection line and the fourth sub-connection line is greater than a distance between the second sub-connection line and the fifth sub-connection line.

19. The display device of claim 18, wherein the third sub-connection line extends in a first direction, and the first sub-connection line and the second sub-connection line extend in a second direction different from the first direction.

20. The display device of claim 18, wherein the first sub-connection line and the second sub-connection line are at a first conductive layer, and the third sub-connection line is at a second conductive layer different from the first conductive layer.

* * * * *